[12] United States Patent
Andrews et al.

(10) Patent No.: US 8,377,622 B2
(45) Date of Patent: Feb. 19, 2013

(54) THERMALLY IMAGEABLE DIELECTRIC LAYERS, THERMAL TRANSFER DONORS AND RECEIVERS

(75) Inventors: Gerald Donald Andrews, Hockessin, DE (US); Richard Kevin Bailey, Newark, DE (US); Graciela Beatriz Blanchet, Wilmington, DE (US); Reid John Chesterfield, Santa Barbara, CA (US); Feng Gao, Hockessin, DE (US); Marc B. Goldfinger, West Chester, PA (US); Gary Delmar Jaycox, West Chester, PA (US); Lynda Kaye Johnson, Wilmington, DE (US); William J. Marshall, Wilmington, DE (US); Elizabeth Forrester McCord, Hockessin, DE (US); Charles Nehemiah McEwen, Newark, DE (US); Jeffrey Scott Meth, Landenberg, PA (US); Geoffrey Nunes, Swarthmore, PA (US); Kenneth George Sharp, Landenberg, PA (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 13/239,826

(22) Filed: Sep. 22, 2011

(65) Prior Publication Data

US 2012/0251802 A1    Oct. 4, 2012

Related U.S. Application Data

(63) Continuation of application No. 11/488,263, filed on Jul. 17, 2006, now Pat. No. 8,062,824.

(51) Int. Cl.
*G03F 7/00*    (2006.01)
*G03F 7/004*   (2006.01)
*B14M 5/40*    (2006.01)
*G03C 8/00*    (2006.01)

(52) U.S. Cl. .................... 430/200; 430/270.1; 430/905; 428/32.74

(58) Field of Classification Search ............... 430/270.1, 430/200, 330, 905; 428/32.74
See application file for complete search history.

(56) References Cited

U.S. PATENT DOCUMENTS

| 5,256,506 | A  | 10/1993 | Ellis et al. |
| 5,362,826 | A  | 11/1994 | Berge et al. |
| 5,534,387 | A  | 7/1996  | Bodager et al. |
| 5,565,301 | A  | 10/1996 | Bodager |
| 5,863,465 | A  | 1/1999  | Kinlen |
| 6,228,555 | B1 | 5/2001  | Hoffend, Jr. et al. |
| 6,645,681 | B2 | 11/2003 | Andrews et al. |
| 7,018,787 | B1 | 3/2006  | Ludemann et al. |
| 2005/0038009 | A1 | 2/2005 | Starke et al. |
| 2005/0038010 | A1 | 2/2005 | Cao et al. |

(Continued)

FOREIGN PATENT DOCUMENTS

| EP | 099228 A2 | 1/1984 |
| EP | 1657074 A1 | 5/2006 |

(Continued)

OTHER PUBLICATIONS

Matsuoka, Infrared Absorbing Materials, 1990, Plenum Press, New York (Book Not Included).

(Continued)

*Primary Examiner* — Amanda C. Walke

(57) ABSTRACT

The invention is related to thermal imageable dielectric layers and thermal transfer donors and receivers comprising dielectric layers. The thermal transfer donors are useful in making electronic devices by thermal transfer of dielectric layers having excellent resistivity, good transfer properties and good adhesion to a variety of receivers.

13 Claims, 4 Drawing Sheets

U.S. PATENT DOCUMENTS

| | | |
|---|---|---|
| 2005/0048406 A1 | 3/2005 | Burberry et al. |
| 2005/0214672 A1 | 9/2005 | Blanchet-Fincher |
| 2007/0077349 A1 | 4/2007 | Newman et al. |

FOREIGN PATENT DOCUMENTS

| | | |
|---|---|---|
| JP | 60178089 A | 9/1985 |
| JP | 60209739 A | 10/1985 |
| WO | 0070399 A | 11/2000 |
| WO | 03052841 A1 | 6/2003 |
| WO | 03099574 A1 | 12/2003 |
| WO | 2005004205 A2 | 1/2005 |
| WO | 2006024012 A1 | 3/2006 |
| WO | 2006043072 A | 4/2006 |

OTHER PUBLICATIONS

Matsuoka, Absorption Spectra of Dyes for Diode Lasers, 1990, Bunshin Publishing Co., Tokyo (Book Not Included).

Ed. G. Wypych, Handbook of Plasticizers, 2004, Chemtec Publishing, Toronto, Ontario (Book Not Included).

S. M. Sze, Physics of Semiconductor Devices, 1981, p. 442, John Wiley and Sons, New York (Book Not Included).

International Search Report for International Application No. PCT/US2007/016118 dated Jan. 4, 2008.

THERMALLY IMAGEABLE DIELECTRIC LAYERS, THERMAL TRANSFER DONORS AND RECEIVERS

CROSS-REFERENCE TO RELATED APPLICATIONS

This application is continuation of, and claims priority under, U.S. Ser. No. 11/488,263, filed Jul. 17, 2006 (now U.S. Pat. No. 8,062,824), which is by this reference incorporated in its entirety as a part hereof for all purposes.

This invention was made with United States Government support under Agreement No. 70NANB2H03032 awarded by NIST Advanced Technology Program. The United States Government has certain rights in the invention.

FIELD OF INVENTION

The invention relates to polymer/dye compositions, dielectric layers and thermal transfer donors useful for printing dielectric layers for electrical applications.

BACKGROUND

Thermal transfer processes are well known in applications such as color proofing as a means of dry transferring or printing of dye and/or pigment layers. Such thermal transfer processes typically use a laser to induce the image-wise thermal transfer of material.

Laser-induced thermal transfer processes typically use a donor element, including a layer of material to be transferred, referred to herein as a transfer layer, and a receiver element, including a surface for receiving the transferred material. Either the substrate of the donor element or the receiver element is transparent, or both are transparent. The donor element and receiver element are brought into close proximity or into contact with each other and selectively exposed to laser radiation, usually by an infrared laser. Heat is generated in the exposed portions of the transfer layer, causing the transfer of those portions of the transfer layer onto the surface of the receiver element. If the material of the transfer layer does not absorb the incoming laser radiation, the donor element should include a heating layer, also known as a light-to-heat conversion (LTHC) layer or a transfer-assist layer, in addition to the transfer layer.

In a typical laser-induced digital thermal transfer process the exposure takes place only in a small, selected region of the assembly at a time, so that transfer of material from the donor element to the receiver element can be built up one region at a time. The region may be a pixel, some portion of a pixel or a plurality of pixels. Computer control facilitates the transfer at high speed and high resolution. Alternatively, in an analog process, the entire assembly is irradiated and a mask is used to selectively expose desired portions of the thermally imageable layer.

A particular need for printable electronics includes thermally imageable insulating layers or dielectric passivation layers. WO 2005/004205, for instance, discloses a method of forming a pattern of filled dielectric material on a substrate by a thermal transfer process comprising exposing to heat a thermally imageable donor element comprising a base film, a light to heat conversion (LTHC) layer, and a transfer layer of dielectric material. In a thin film transistor (TFT), the dielectric layer serves to insulate the gate layer from the semiconductor and source-drain layers. Its primary function is to allow the passage of fields, but not currents. A fundamental requirement is that the dielectric layer possess high volume resistivity, greater than $10^{14}$ ohm-cm, to prevent leakage currents; and be largely pinhole free to prevent catastrophic shorts between conductive layers. The dielectric layer also must have high purity in order not to dope the adjacent semiconductor layer; it should be thin, for instance, about 5 microns or less, and have a high dielectric constant for low-voltage operation.

Additional requirements for successful thermal transfer of the dielectric layer include: the dielectric composition must be coatable and therefore must have adequate solubility and/or dispersability in a suitable solvent; it must exhibit good interfacial behavior (mechanical, electrical) with adjacent layers, including the receiver, the conducting layers (gate and source-drain layers) and the semiconductor layer; and it must be printable by thermal transfer and maintain its insulating properties. In order for an insulating layer to meet this last requirement and be printed in one printing cycle, it needs to exhibit good adhesion to all previous layers including receiver, conducting layers and semiconductor layers. It must print under approximately the same conditions (e.g., same drum speed and power) onto all of the different previous layers, and it must print with acceptable quality. For example, defects caused by the thermal transfer process including: pinholes, bubbles, cohesive failure, breaks at swath boundaries, and co-transfer of materials from the adjacent donor substrate layers (typically the LTHC layer); must be very minimal in order not to degrade electrical performance to an unacceptable level.

There is a need for thermal transfer donors that allow patterned thermal transfer of dielectric layers with excellent resistivity that exhibit good transfer properties and good adhesion to a variety of materials. Particularly desirable are thermal transfer donors wherein, after transfer, the patterned layer has the uniformity, continuity and resistive properties required of a dielectric layer in electrical applications, for instance in applications for capacitors or thin film transistors.

SUMMARY OF INVENTION

One aspect of the invention is a composition, comprising: (a) one or more dielectric polymer(s) selected from the group consisting of: acrylic and styrenic polymers selected from the group consisting of: acrylic, styrenic and styrenic-acrylic latexes, solution-based acrylic, styrenic and styrenic-acrylic polymers, and combinations thereof; heteroatom-substituted styrenic polymers selected from the group consisting of: partially hydrogenated poly(4-hydroxy)styrene, poly(4-hydroxy)styrene, and copolymers of poly(4-hydroxy)styrene with hydroxyethyl (meth)acrylate, alkyl (meth)acrylate, styrene, and alkyl-substituted styrene wherein the alkyl group is a C1 to C18 straight or branched chain alkyl group; phenol-aldehyde (co)polymers and (co)oligomers and combinations thereof; and poly(vinyl acetate); and (b) about 0.5 wt % to about 10 wt %, based on a dry weight of the composition, of one or more near-IR dye(s); wherein a dry layer comprising said composition has a resistivity of $10^{14}$ ohm-cm or greater and has an absorption maximum in the range of about 600 to about 1200 nm.

Another aspect of the invention is a dielectric layer, with a resistivity of about $10^{14}$ ohm-cm or greater, comprising at least one Layer A, comprising: (a) one or more dielectric polymer(s) selected from the group consisting of: acrylic and styrenic polymers selected from the group consisting of: acrylic, styrenic and styrenic-acrylic latexes, solution-based acrylic, styrenic and styrenic-acrylic polymers, and combinations thereof; heteroatom-substituted styrenic polymers selected from the group consisting of: partially hydrogenated poly(4-hydroxystyrene), poly(4-hydroxystyrene), and copolymers of poly(4-hydroxystyrene) with hydroxyethyl (meth)acrylate, alkyl (meth)acrylate, styrene, and alkyl-substituted styrene wherein the alkyl group is a C1 to C18 straight or branched chain alkyl group; phenol-aldehyde (co)polymers and (co)oligomers and combinations thereof; and poly (vinyl acetate); and (b) about 0.5 wt % to about 10 wt %, based on a dry weight of Layer A, of one or more near-IR dye(s) having an absorption maximum in the range of about 600 to about 1200 nm within Layer A.

Another aspect of the invention is a multilayer thermal imaging donor comprising: (a) a base film; and (b) a dielectric transfer layer comprising at least one Layer A comprising: one or more dielectric polymer(s) selected from the group consisting of: acrylic and styrenic polymers selected from the group consisting of: acrylic, styrenic and styrenic-acrylic latexes, solution-based acrylic, styrenic and styrenic-acrylic polymers, and combinations thereof; heteroatom-substituted styrenic polymers selected from the group consisting of: partially hydrogenated poly(4-hydroxystyrene), poly(4-hydroxystyrene), and copolymers of poly(4-hydroxystyrene) with hydroxyethyl (meth)acrylate, alkyl (meth)acrylate, styrene, and alkyl-substituted styrene wherein the alkyl group is a C1 to C18 straight or branched chain alkyl group; phenol-aldehyde (co)polymers and (co)oligomers and combinations thereof; and poly(vinyl acetate); and about 0.5 wt % to about 10 wt %, based on the dry weight of Layer A, of one or more near-IR dye(s) having an absorption maximum in the range of 600 to about 1200 nm within Layer A; wherein the dielectric transfer layer has a resistivity of $10^{14}$ ohm-cm or greater.

DETAILED DESCRIPTON

Figure 1A:
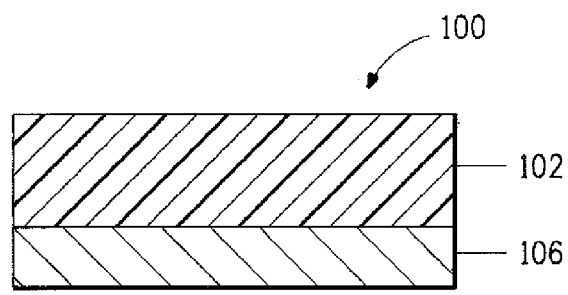
FIG. 1A is a cross-sectional view of a thermal imaging donor 100 comprising a dielectric transfer layer 106 and a base film 102.

Herein the terms "acrylic", "acrylic resin", "(meth)acrylic resins", and "acrylic polymers", are synonymous unless specifically defined otherwise. These terms refer to the general class of addition polymers derived from the conventional polymerization of ethylenically unsaturated monomers derived from methacrylic and acrylic acids and alkyl and substituted-alkyl esters thereof. The terms encompass homopolymers and copolymers. The terms encompass specifically the homopolymers and copolymers of methyl (meth) acrylate, ethyl (meth)acrylate, butyl (meth)acrylate, 2-hydroxyethyl (meth)acrylate, (meth)acrylic acid and glycidyl (meth)acrylate. The term copolymer herein encompasses polymers derived from polymerization of two or more monomers, unless specifically defined otherwise. The term (meth) acrylic acid encompasses both methacrylic acid and acrylic acid. The term (meth)acrylate, encompasses methacrylate and acrylate.

The terms "styrene acrylic polymers", "acrylic styrene" and "styrene acrylic" are synonymous and encompass copolymers of the above described "acrylic resins" with styrene and substituted styrene monomers, for instance alpha-methyl styrene.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

Dielectric Layers and Compositions

One embodiment of the invention is a dielectric layer having a resistivity of about $10^{14}$ ohm-cm or greater comprising at least one layer of material, herein referred to as Layer A, comprising: one or more dielectric polymers selected from the group consisting of: acrylic and styrenic polymers selected from the group consisting of: acrylic, styrenic and styrenic-acrylic latexes, solution-based acrylic, styrenic and styrenic-acrylic polymers, and combinations thereof; heteroatom-substituted styrenic polymers selected from the group consisting of: partially hydrogenated poly(4-hydroxy) styrene, poly(4-hydroxy)styrene, and copolymers of poly(4-hydroxy)styrene with hydroxyethyl (meth)acrylate, alkyl (meth)acrylate, styrene, and alkyl-substituted styrene wherein the alkyl group is a C1 to C18 straight or branched chain alkyl group; phenol-aldehyde (co)polymers and (co) oligomers and combinations thereof; and poly(vinyl acetate; and about 0.5 wt % to about 10 wt %, based on the dry weight of Layer A, of one or more near-IR dye(s) having an absorption maximum in the range of about 600 to about 1200 nm within Layer A. In a preferred embodiment the dielectric layer consists essentially of one or more of the dielectric polymers and about 0.5 wt % to about 10 wt %, of one or more near-IR dye(s) described herein. The term dielectric polymers herein encompasses homopolymers, copolymers derived from polymerization of two or more monomers, post-derivatized (co)polymers including graft (co)polymers, and low molecular weight homopolymers or copolymers. The polymers may be linear, branched, hyperbranched or dendritic.

Preferred dielectric polymers for Layer A include acrylic, styrenic and styrenic-acrylic latexes comprising alkyl (meth) acrylate, styrene, and alkyl-substituted styrene wherein the alkyl group is a C1 to C18 straight or branched chain alkyl group. Preferred optional monomers for these latex-based polymers include (meth)acrylic acid, hydroxyethyl (meth) acrylate and glycidyl (meth)acrylate. More preferred acrylic, styrenic and styrenic-acrylic latexes are selected from the group consisting of: Latexes A, defined herein as one or more latex resins comprising at least about 85 wt %, preferably at least about 90 wt %, and more preferably at least about 95 wt %, of monomers selected from the group: alkyl (meth)acrylate, styrene, and alkyl-substituted styrene wherein the alkyl group is a C1 to C18 straight or branched chain alkyl group. Preferred optional monomers for these latex resins include (meth)acrylic acid, preferably up to about 5 wt %, hydroxyethyl (meth)acrylate, preferably up to about 10 wt %, and glycidyl (meth)acrylate, preferably up to about 5 wt %. Preferably the latexes have an average particle size of less than about 150 nm, more preferably, less than about 100 nm, and an acid number less than about 100. preferably less than about 75, and more preferably less than about 25.

Particularly preferred polymers for Layer A are Acrylic Latexes B and Styrene-Acrylic Latexes C and combinations thereof. Acrylic Latexes B are defined herein as one or more acrylic latexes comprising at least about 85 wt %, preferably at least about 90 wt %, and more preferably at least about 95 wt %, of monomers selected from the group consisting of: methyl methacrylate and butyl acrylate. Styrene Acrylic Latexes C are defined herein as one or more styrene-acrylic latexes comprising at least about 85 wt %, preferably at least about 90 wt %, and more preferably at least about 95 wt %, of monomers selected from the group consisting of: methyl methacrylate, butyl acrylate and styrene. Preferred optional monomers for Acrylic Latexes B and Styrene-Acrylic Latexes C include: (meth)acrylic acid, preferably up to about 5 wt %, hydroxyethyl methacrylate, preferably up to about 10 wt %, and glycidyl methacrylate, preferably up to about 5 wt %.

Commercial examples of acrylic and styrenic acrylic latexes useful as dielectric polymers include Joncryl® 95 and 1915 (co)polymers (Johnson Polymer). Methods for synthesizng suitable latex polymers have been reported in WO 03/099574.

Further preferred dielectric polymers for Layer A include solution-based acrylic, styrenic and styrenic-acrylic polymers. Herein the term "solution-based" refers to materials that are soluble in solvents such as water and/or one or more common organic solvents including alcohols, e.g. ethanol and butoxyethanol; ethers, e.g. dimethoxyethane; esters, e.g. ethyl and butyl acetate; ketones, e.g., acetone and 2-butanone; and aromatic hydrocarbons, e.g. xylenes. Preferred solution-based acrylic, styrenic and styrenic-acrylic polymers have a $M_w$ of less than about 100,000, preferably less than 50,000, and more preferably less than 30,000. Furthermore, preferred solution-based acrylic, styrenic and styrenic-acrylic polymers have an acid number less than about 250. Preferred solution-based acrylic, styrenic and styrenic-acrylic polymers comprise alkyl (meth)acrylate, benzyl (meth)acrylate, styrene, and alkyl-substituted styrene wherein the alkyl group is a C1 to C18 straight or branched chain alkyl group. Preferred optional monomers for these solution-based polymers include (meth)acrylic acid and hydroxyethyl (meth)acrylate.

A particularly preferred material for Layer A is a combination of the acrylic, styrenic and styrenic-acrylic latexes and water-based acrylic, styrenic and styrenic-acrylic polymers described above. Preferably the combination comprises about 20 wt % to about 80 wt %, more preferably about 40 wt % to about 80 wt %, of an acrylic or styrenic-acrylic latex fraction and about 20 wt % to about 80 wt %, more preferably about 20 wt % to about 60 wt %, of a water-based acrylic or styrenic-acrylic polymer fraction, based on the dry weight of the combination.

Other preferred dielectric polymers for Layer A include heteroatom-substituted styrenic polymers selected from the group consisting of: partially hydrogenated poly(4-hydroxy) styrene, poly(4-hydroxy)styrene (PHS), and copolymers of PHS with hydroxyethyl (meth)acrylate, alkyl (meth)acrylate, styrene, and alkyl-substituted styrene wherein the alkyl group is a C1 to C18 straight or branched chain alkyl group. Particularly preferred comonomers are hydroxyethyl methacrylate, butyl acrylate, methyl methacrylate and styrene with hydroxyethylmethacrylate and butyl acrylate being especially preferred. The PHS (co)polymers may be linear or branched. When PHS homopolymer is used, the branched structure is preferred Preferred (co)polymers of this class have a $M_w$ of less than about 30,000 and preferably less than about 20,000 and more preferably less than about 10,000. Partially hydrogenated PHS refers to PHS polymers that have been hydrogenated up to about 50 equivalent % of the unsaturation within the polymer and preferred polymers are hydrogenated to about 10 to 20 equivalent %. Commercial examples include PHS-B (branched PHS homopolymer; DuPont Electronic Technologies, Dallas, Tex.), Maruka Lyncur CMM (PHS copolymer with methyl methacrylate; Maruzen Petrochemical Co., LTD. Tokyo, Japan), Maruka Lyncur CHM (PHS copolymer with hydroxyethyl methacrylate; Maruzen), Maruka Lyncur CBA (PHS copolymer with buyl acrylate, Maruzen), Maruka Lyncur CST 15, 50, and 70 (PHS copolymers with styrene, Maruzen), and Maruka Lyncur PHM-C (partially hydrogenated PHS, Maruzen).

Other preferred dielectric polymers for Layer A include those selected from the group consisting of: phenol-aldehyde (co)polymers/(co)oligomers and combinations thereof. Preferred (co)polymers/(co)oligomers in this class are derived from mono- and bis-phenols and mono- and bis-aldehydes selected from the group consisting of: phenol; alkyl- and aryl-substituted phenols; formaldehyde; and alkyl-, aryl- and heteroatom-substituted aldehydes. The phenol-aldehyde resins can be further derivatized, e.g., the hydroxy group converted to an ether group. Preferred (co)polymers/(co)oligomers within this group have a $M_w$ of about 20,000 or less, preferably about 10,000 or less. Commercial examples include Novolac®/Novolak® resins (Schenectady International Inc., Schenectady N.Y.).

Other preferred dielectric polymers for Layer A include poly(vinyl acetate) homopolymer. Preferred polymers within this group have a $M_w$ of about 100,000 or less.

The above polymers may be plasticized for improved flexibility, adhesion, compatibilization with an IR dye, among other characteristics. In certain instances, the plasticizer may be selected from the above classes of polymers. For example, a higher Tg or higher molecular weight (MW) phenol-aldehyde polymer can be blended with a lower Tg or lower MW phenol-aldehyde polymer. Another example is PHS blended with a phenol-aldehyde polymer. Examples of suitable plasticizers for some of the above classes of polymers comprise poly(ethylene) glycol, glycerol ethoxylate, di(ethyleneglycol) dibenzoate, and phthalate-based plasticizers such as dibutyl phthalate. A number of potentially suitable plasticizers for various polymers and details regarding their use may be found in the following reference: "*Handbook of Plasticizers,*" Ed. G. Wypych, ChemTec Publishing, Toronto, Ont. 2004.

The dielectric Layer A comprises about 0.5 wt % to about 10 wt %, and more preferably about 0.5 wt % to about 6 wt %, based on the dry weight of the layer of material, of one or more near-IR dye(s) having an absorption maximum in the range of about 600 to about 1200 nm within the layer of material. Preferably the near-IR dye is chosen such that its absorption band overlaps with the emission band of the exposure laser used in the transfer process. Typically, the exposure laser emits radiation in the near-IR range. Preferred classes of dyes are the cyanine compound(s) selected from the group consisting of: indocyanines, phthalocyanines including polysubstituted phthalocyanines and metal-containing phthalocyanines, and merocyanines. A particularly preferred class of near-IR dye(s) is that of indocyanine dyes, preferably having absorption at about 830 nm. A number of suitable indocyanine dyes absorbing at around 830 nm and with solubility in different solvents and in water are available from H. W. Sands Co. and other sources. Preferred near-IR dyes for the invention are selected from the group: 3H-indolium, 2-[2-[2-chloro-3-[(1,3-dihydro-1,3,3-trimethyl-2H-indol-2-ylidene)ethylidene]-1-cyclopenten-1-yl]ethenyl]-1,3,3-trimethyl-, salt with trifluoromethanesulfonic acid (1:1) having CAS No. [128433-68-1]; 2-(2-(2-chloro-3-(2-(1,3-dihydro-1,1-dimethyl-3-(4-sulphobutyl)-2H-benz[e]indol-2-ylidene) ethylidene)-1-cyclohexene-1-yl)ethenyl)-1,1-dimethyl-3-(4-sulphobutyl)-1H-benz[e]indolium, inner salt, free acid having CAS No. [162411-28-1]; and indolenine dyes corresponding to formulas (I) and (II) and resonance structures thereof:

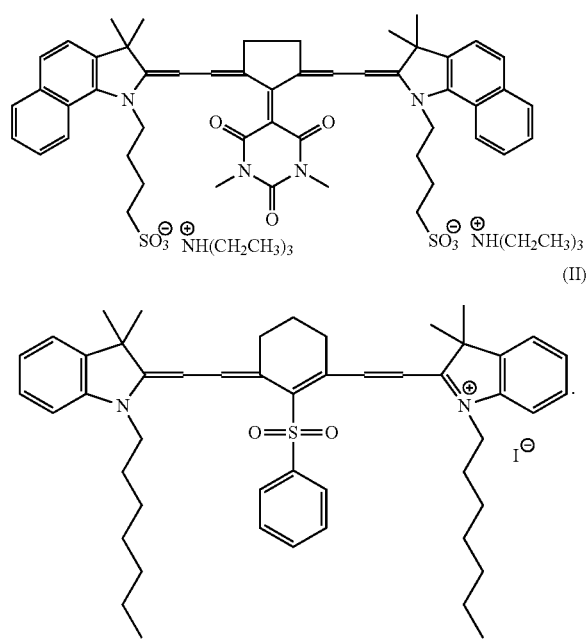

Preferred dye levels in the material will give a film OD of about 0.2 or greater, with an OD of about 0.5 to about 1.5 being preferred. To reach a preferred OD, unfilled water-based latex systems will typically require a higher dye loading of about 4 to 6 wt %. Unfilled solution-based systems will typically require lower dye loadings of about 0.5 to about 2 wt %.

In another embodiment the dielectric layer comprises two or more Layers A that are gradient dye layers with each gradient dye layer independently having a dry wt % of near-IR dye of about 0.5 to about 10 wt %; wherein at least one gradient dye layer has a lower wt % of near-IR dye, at least one gradient dye layer has a higher wt % of near-IR dye, and said higher wt % of near-IR dye is a value at least 20% higher than that of the lower wt % of near-IR dye.

In another embodiment Layer A further comprises a high κ (high dielectric constant) nanoparticle fraction, of about 10 to about 90 wt based on the dry weight of Layer A, with the nanoparticle fraction having a dielectric constant greater than about 20, and an average particle size of about 5 nm to about 500 nm. Herein high κ dielectric nanoparticle fraction refers to nanoparticles with a dielectric constant of about 20 and above, preferably about 30 and above, and more preferably about 100 and above. Preferred dielectric polymers for practicing this embodiment are selected from the group consisting of: acrylic and styrenic-acrylic latexes, solution-based acrylic and styrenic-acrylic (co)polymers, and combinations thereof; and phenol-aldehyde (co)polymers/(co)oligomers; as described above. Preferred high κ dielectric nanoparticles for practicing this embodiment are selected from the group consisting of: barium titanate, strontium titanate, barium strontium titanate and titanium dioxide.

In another embodiment the dielectric layer comprises two or more Layers A that are gradient nanoparticle layers with each gradient nanoparticle layer independently having a dry wt % of high κ nanoparticle fraction of about 10 to about 90 wt %; wherein at least one gradient nanoparticle layer has a lower wt % of high κ nanoparticle fraction and at least one gradient nanoparticle layer has a higher wt % of high κ nanoparticle fraction, and said higher wt % of high κ nanoparticle fraction is a value at least 20% higher than that of the lower wt %.

In another embodiment the dielectric layer further comprises an additional dielectric layer, herein referred to as Layer B, comprising one or more dielectric polymers, having a resistivity of about $10^{14}$ ohm-cm or greater. Extensive lists of dielectric polymers can be found in WO 03/052841 and WO 06/024012. Preferred dielectric polymers for Layer B are selected from the group consisting of: acrylic and styrenic polymers selected from the group: acrylic, styrenic and styrenic-acrylic latexes, solution-based acrylic, styrenic and styrenic-acrylic polymers, and combinations thereof; heteroatom-substituted styrenic polymers selected from the group consisting of: partially hydrogenated poly(4-hydroxy)styrene, poly(4-hydroxy)styrene, and copolymers of poly(4-hydroxy)styrene with hydroxyethyl (meth)acrylate, alkyl (meth)acrylate, styrene, and alkyl-substituted styrene wherein the alkyl group is a C1 to C18 straight or branched chain alkyl group; phenol-aldehyde (co)polymers and (co) oligomers and combinations thereof; and poly(vinyl acetate) as described above. This embodiment can be further practiced including other embodiments disclosed above. Optional additives for Layer B include up to 1 wt % carbon black and high κ nanoparticles with preferred high κ dielectric nanoparticles for practicing this embodiment selected from the group: barium titanate, strontium titanate, barium strontium titanate and titanium dioxide.

Layer A and optional Layer B may include additives such as fillers, surfactants, defoamers, dispersants and grinding aids. Numerous surfactants, defoamers, dispersants and grinding aids are available that are suitable for this purpose. Selection will often be based upon observed coating and dispersion quality and the desired adhesion of the dielectric layer to other layers in the thermal transfer process. In certain embodiments, the surfactants comprise siloxy-, fluoryl-, alkyl- and alkynyl-substituted surfactants. These include the Byk® (Byk Chemie), Zonyl®(DuPont), Triton® (Dow), Surfynol@ (Air Products) and Dynol® (Air Products) surfactants. Preferred surfactants are Byk® 345, 346 and 348 and Zonyl® FSO and FSN. In certain embodiments, the defoamers comprise alkyl and alkynyl functionality and include Surfynol® defoamers. In certain embodiments, the disperants comprise functionalized polymers, oligomers and monomers and include Surfynol® and Disperbyk® dispersants.

The Tgs of the dielectric polymers utilized in Layer A and Layer B range from about −30 to about 150° C., and preferably about 20 to about 90° C. and most preferably about 30 to about 70° C. Typically, the addition of fillers enables the utilization of lower Tg polymers and the addition of plasticizers enables the utilization of higher Tg polymers. The preferred Tg of the dielectric layer itself and of the layers utilized in the dielectric layer, including Layer A and Layer B is about 30 to about 100° C., preferably about 40 to about 85° C. and most preferably about 45 to about 65° C.

The preferred thickness of the dielectric layer and of the layers utilized in the dielectric layer, including Layer A and Layer B, is about 0.05 to about 10 microns, preferably about 0.1 to about 5 microns, and more preferably about 0.2 to about 3 microns.

Another embodiment is a composition useful for preparing the dielectric layer(s) of the invention comprising one or more dielectric polymer(s) and one or more near-IR dye(s) as described above for Layer A; wherein a dry layer comprising said composition has a resistivity of $10^{14}$ ohm-cm or greater and has an absorption maximum in the region of about 600 to about 1200 nm. In a related embodiment the composition of the invention further comprises a high κ nanoparticle fraction up to 90 wt % based on the dry weight of the composition, with the proviso that if the nanoparticle fraction is greater than 80 wt %, the near-IR dye is less than 6 wt % of the composition. In a preferred embodiment the composition consists essentially of one or more dielectric polymer(s) and one or more near-IR dye(s) as described above for Layer A. In another preferred embodiment the composition further consists essentially of a high κ nanoparticle fraction up to 90 wt % based on the dry weight of the composition, with the proviso that if the nanoparticle fraction is greater than 80 wt %, the near-IR dye is less than 6 wt % of the composition.

Compositions useful for preparing the dielectric layer(s) can be prepared by dispersing and/or dissolving the dielectric polymer(s), near-IR dye(s) and, optionally, the high κ nanoparticle fraction, in a suitable volatile carrier fluid to provide a solution or suspension. Typically the volatile carrier fluid is water, an organic solvent, a gaseous material, or some combination thereof. The volatile carrier fluid is chosen to be compatible with the various components of the composition. Examples of volatile carrier fluids include water, lower alcohols such as ethanol, aliphatic and aromatic hydrocarbons such as hexane, cyclohexane and xylenes; ethers such as dibutyl ether; ether alcohols such as 2-methoxyethanol; esters such as butyl acetate; and aliphatic and aromatic halocarbons such as 1,2-dichloroethane. Lower molecular weight oligomers and small molecules useful as processing aids including the dispersants and surfactants listed above may be present in the compositions.

A dielectric layer can be made by coating a solution or suspension onto a suitable substrate and removing the carrier fluid. Applying the solution or suspension can be accomplished by any method that gives a uniform layer, or if desired, a patterned or non-uniform layer. Coating, including rod-coating, extrusion coating, gravure coating and spin-coating, spraying, printing, blading or knifing can be used. Coating and spraying are preferred methods. Many commercial coating machines, devices such as a coating rod and knife blade, and printing machines can be used to apply the solution or suspension. The carrier fluid is allowed to evaporate to provide the dielectric layer. The dielectric layer can be dried by any conventional method of drying including applying heat and vacuum.

Multilayer Thermal Imaging Donor

Another embodiment of the invention is a multilayer thermal imaging donor comprising: a base film; and a dielectric transfer layer comprising at least one Layer A as described above, wherein the dielectric transfer layer is has a resistivity of $10^{14}$ ohm-cm or greater. In various embodiments the thermal imaging donor may include: an LTHC layer interposed between the base film and the dielectric transfer layer; an interlayer interposed between the base film and the dielectric transfer layer; and an interlayer interposed between an LTHC layer and the dielectric transfer layer. In another embodiment, the dielectric transfer layer may further comprise one or more additional dielectric layer(s) comprising Layer B as described above. The additional dielectric layer(s) may be below and/or on top of Layer A.

The thermal imaging donor may optionally include other layers known in the art, for example, an antistatic layer may be present adjacent the base film and opposite the transfer layer; a primer layer, ejection layer, and/or an underlayer may be disposed between the base film and the LTHC layer; and an adhesive layer may be disposed adjacent the dielectric transfer layer opposite the base film. Thus, one or more other conventional thermal transfer donor element layers can be included in the thermal imaging donor of the present invention, including but not limited to an interlayer, primer layer, release layer, ejection layer, thermal insulating layer, underlayer, adhesive layer, humectant layer, and light attenuating layer.

FIG. 1A is a cross-sectional view of thermal imaging donor 100, in accordance with one embodiment of the invention. Thermal imaging donor 100 comprises a base film 102 and a dielectric transfer layer 106 on the surface of the base film.

Base film 102 provides support to the other layers of thermal imaging donor 100. Base film 102 comprises a flexible polymer film and is preferably transparent. A suitable thickness for base film 102 is about 25 μm to about 200 μm, although thicker or thinner support layers may be used. The base film may be stretched by standard processes known in the art for producing oriented films and one or more other layers, such as the LTHC layer, may be coated onto the base film prior to completion of the stretching process. Preferred base films comprise a polymeric material selected from the group consisting of: polyethylene terephthalate (PET), polyethylene naphthalate (PEN), triacetyl cellulose and polyimide with PET being especially preferred.

Light-Attenuating Agent

A light-attenuating agent may be present in a discrete layer or incorporated in one of the other functional layers of the donor element, such as the base film, the LTHC layer or the dielectric transfer layer. In one embodiment, the base film comprises a small amount (typically 0.2% to 0.5% by weight of the base film) of a light-attenuating agent such as a dye which can assist in the focusing of the radiation source onto the radiation-absorber in the LTHC layer during the thermal imaging step, thereby improving the efficiency of the transfer process. U.S. Pat. No. 6,645,681, incorporated herein by reference, describes this and other ways in which the base film may be modified to assist in the focusing of a laser radiation source in which the equipment comprises an imaging laser and a non-imaging laser wherein the non-imaging laser has a light detector that is in communication with the imaging laser. The wavelength ranges at which the imaging and non-imaging laser operate (typically in the range from about 300 nm to about 1500 nm) determine the wavelength ranges in which the absorber(s) and/or diffuser(s) are active and inactive. For example, if the non-imaging laser operates in about the 670 nm region and the imaging laser at 830 nm, it is preferred that the absorber and/or diffuser operate to absorb or diffuse light in the 670 nm region, rather than in the 830 nm region. Herein, the light attenuating agent preferably absorbs or diffuses light in the visible region, and in one embodiment absorbs around 670 nm. Suitable light-attenuating agents are well known in the art and include the commercially available Disperse Blue 60 and Solvent Green 28 dyes and carbon black. Preferably the amount of light-attenuating agent is sufficient to achieve an optical density (OD) of 0.1 or greater at some wavelength of about 400 to about 750 nm, more preferably about 0.3 to about 1.5.

The light-attenuating agent of U.S. Pat. No. 6,645,681 referred to herein above may be incorporated into the dielectric transfer layer instead of, or additionally to, the base film. The nature of this light-attenuating agent will be dependent on the particular laser and printing system that is utilized. Dyes useful as attenuating agents for polymer-based dielectric layers include Oil Blue N and Methylene Blue.

Light to Heat Conversion Layer (LTHC)

Figure 1B:
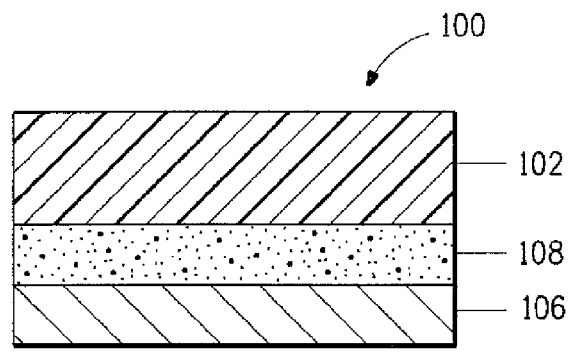
FIG. 1B is a cross-sectional view of a thermal imaging donor 100 comprising a LTHC layer 108.

The thermal imaging donor may, optionally, have a light-to-heat-conversion layer (LTHC) interposed between the base film and the other layers. FIG. 1B is a cross-sectional view of thermal imaging donor 100, in accordance with another embodiment of the invention. Thermal imaging donor 100 comprises a LTHC layer 108 interposed between base film 102 and the dielectric transfer layer 106.

The LTHC layer 108 is incorporated as a part of thermal imaging donor 100 for radiation-induced thermal transfer to couple the energy of light radiated from a light-emitting source into the thermal transfer donor.

Typically, the radiation absorber in the LTHC layer (or other layers) absorbs light in the infrared, visible, and/or ultraviolet regions of the electromagnetic spectrum and converts the absorbed light into heat. The radiation absorber is typically highly absorptive, providing an optical density (OD) at the wavelength of the imaging radiation of 0.1 to 3 or higher, and preferably from 0.2 to 2.

Suitable radiation absorbing materials can include, for example, dyes (e.g., visible dyes, ultraviolet dyes, infrared dyes, fluorescent dyes, and radiation-polarizing dyes), pigments, metals, metal compounds, metal films, and other suitable absorbing materials. Suitable radiation absorbers and binders for LTHC layers are well-known in the art and extensive lists and references can be found in PCT/US05/38010; PCT/US05/38009; U.S. Pat. No. 6,228,555 B1; Matsuoka, M., "*Infrared Absorbing Materials*", Plenum Press, New York, 1990; and Matsuoka, M., *Absorption Spectra of Dyes for Diode Lasers*, Bunshin Publishing Co., Tokyo, 1990; which are herein incorporated by reference. One example of a suitable LTHC layer can include a pigment, such as carbon black, and a binder, such as an organic polymer. Preferred classes of near-infrared dyes are cyanine compounds selected from the group consisting of: indocyanines, phthalocyanines including polysubstituted phthalocyanines and metal-containing phthalocyanines, and merocyanines.

Sources of suitable infrared-absorbing dyes include H. W. Sands Corporation (Jupiter, Fla., US), American Cyanamid Co. (Wayne, N.J.), Cytec Industries (West Paterson, N.J.), Glendale Protective Technologies, Inc. (Lakeland, Fla.) and Hampford Research Inc. (Stratford, Conn.). Preferred dyes for LTHC and transfer layers are 3H-indolium, 2-[2-[2-chloro-3-[(1,3-dihydro-1,3,3-trimethyl-2indol-2-ylidene)ethylidene]-1-cyclopenten-1-yl]ethenyl]-1,3,3-trimethyl-, salt with trifluoromethanesulfonic acid (1:1) having CAS No. [128433-68-1], available from Hampford Research Inc, Stratford, Conn., as TIC-5c; 2-(2-(2-chloro-3-(2-(1,3-dihydro-1,1-dimethyl-3-(4-sulphobutyl)-2benz[e]indol-2-ylidene)ethylidene)-1-cyclohexene-1-yl)ethenyl)-1,1-dimethyl-3-(4-sulphobutyl)-1H-benz[e]indolium, inner salt, free acid having CAS No. [162411-28-1], available from H. W. Sands Corp, as SDA 4927; and indolenine dyes SDA 2860 and SDA 4733 from H. W. Sands Corp. SDA 4927 is an especially preferred dye for the LTHC layer.

An LTHC layer may include a particulate radiation absorber in a binder. Examples of suitable pigments include carbon black and graphite. The weight percent of the radiation absorber in the LTHC layer, excluding the solvent in the calculation of weight percent, is generally from about 1 wt % to about 85 wt %, preferably from 3 wt % to 60 wt %, and most preferably from 5 wt % to 40 wt %, depending on the particular radiation absorber(s) and binder(s) used in the LTHC layer. Suitable binders for use in the LTHC layer include film-forming polymers, such as, for example, phenolic resins (e.g., novolak and resole resins), polyvinyl butyral resins, polyvinyl acetates, polyvinyl acetals, polyvinylidene chlorides, polyacrylates, and styrene acrylics. The % transmittance of the LTHC layer is affected by the identity and amount of the radiation absorber and the thickness of the LTHC layer. The LTHC layer should exhibit radiation transmission of about 20% to about 80%, more preferably of about 40% to about 50%, at the wavelength of the imaging radiation used in the thermal transfer imaging process. When a binder is present, the weight ratio of radiation absorber to binder is about 5:1 to about 1:1000 by weight, preferably about 2:1 to about 1:100 by weight. A polymeric or organic LTHC layer is coated to a thickness of 0.05 µm to 20 µm, preferably, 0.05 µm to 10 µm, and, more preferably, 0.1 µm to 5 µm.

In preferred embodiments, the LTHC layer is based upon a broad variety of water-soluble or water-dispersible polymeric binders with compositions as disclosed in the above referenced PCT/US05/38010 and PCT/US05/38009. Preferably, the average particle size of a water-dispersible binder in its aqueous phase is less than 0.1 micron, and more preferably less than 0.05 micron, and preferably having a narrow particle size distribution.

Preferred water-soluble or water-dispersible polymeric binders for LTHC layers useful in the invention are those selected from the group: acrylic resins and hydrophilic polyesters and more preferably sulphonated polyesters as described in the above referenced PCT/US05/38009. Other preferred polymeric binders for LTHC layers are maleic anhydride polymers and copolymers including those comprising functionality provided by treating the maleic anhydride polymers and/or copolymers with alcohols, amines, and alkali metal hydroxides. Specific maleic anhydride based copolymers comprise the structure represented by formula (III)

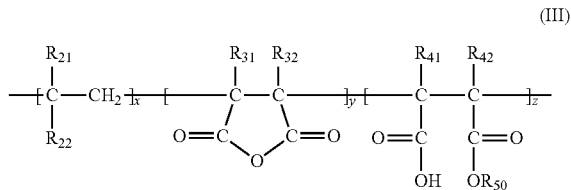

(III)

wherein x and z are any positive integer;
wherein y is zero or any positive integer;
$R_{21}$ and $R_{22}$ can be the same or different, and individually are hydrogen, alkyl, aryl, aralkyl, cycloalkyl, and halogen, provided that one of $R_{21}$ and
$R_{22}$ is an aromatic group;
$R_{31}$, $R_{32}$, $R_{41}$ and $R_{42}$ are the same or different groups, which can be hydrogen or alkyl of one to about five carbon atoms; and
$R_{50}$ is functional group selected from:
  a) alkyl, aralkyl, alkyl-substituted aralkyl radicals containing from one to about twenty carbon atoms;
  b) oxyalkylated derivatives of alkyl, aralkyl, alkyl-substituted aralkyl radicals containing from about two to about four carbon atoms in each oxyalkylene group, which can be of one to about twenty repeating units;
  c) oxyalkylated derivatives of alkyl, aralkyl, alkyl-substituted aralkyl radicals containing from about two to about four carbon atoms in each oxyalkylene group, which can be of one to about six repeating units;
  d) at least one unsaturated moiety;
  e) at least one heteroatom moiety;
  f) alkaline molecules capable of forming salts selected from Li, Na, K and $NH_4^+$, and
  g) combinations thereof.

A preferred maleic anhydride polymer for LTHC layers comprises a copolymer of formula (III), wherein $R_{21}$, $R_{31}$, $R_{32}$, $R_{33}$, $R_{41}$, $R_{42}$, $R_{43}$, are individually hydrogen, $R_{22}$ is phenyl, and $R_{50}$ is 2-(n-butoxy)ethyl. A specific example of a maleic anhydride copolymer useful in LTHC layers is a styrene maleic anhydride copolymer such as SMA 1440H, a product of Sartomer Corporation, Exton, Pa.

In one embodiment of the invention, a preferred LTHC layer comprises one or more water-soluble or water-dispersible radiation-absorbing cyanine compound(s) selected from the group consisting of: indocyanines, phthalocyanines including polysubstituted phthalocyanines and metal-containing phthalocyanines, and merocyanines; and one or more water-soluble or water-dispersible polymeric binders selected from the group consisting of: acrylic resins, hydrophilic polyesters, sulphonated polyesters, and maleic anhydride homopolymers and copolymers. A most preferred LTHC layer further comprises one or more release modifiers selected from the group consisting of: quaternary ammonium cationic compounds; phosphate anionic compounds; phosphonate anionic compounds; compounds comprising from one to five ester groups and from two to ten hydroxyl groups; alkoxylated amine compounds; and combinations thereof.

Metal radiation absorbers also may be used as LTHC layers, either in the form of particles or as films, as disclosed in U.S. Pat. No. 5,256,506 hereby incorporated by reference. Nickel and chromium are preferred metals for the LTHC layer 108, with chromium being especially preferred. Any other suitable metal for the heating layer can be used. The preferred thickness of the heating layer depends on the optical absorption of the metals used. For chromium, nickel/vanadium alloy or nickel, a layer of 80-100 Angstroms is preferred.

Preferred radiation absorbers for LTHC layers utilized herein are selected from the group: metal films selected from Cr and Ni; carbon black; graphite; and near infrared dyes with an absorption maxima in the range of about 600 to 1200 nm within the LTHC layer.

Interlayer

Figure 2A:
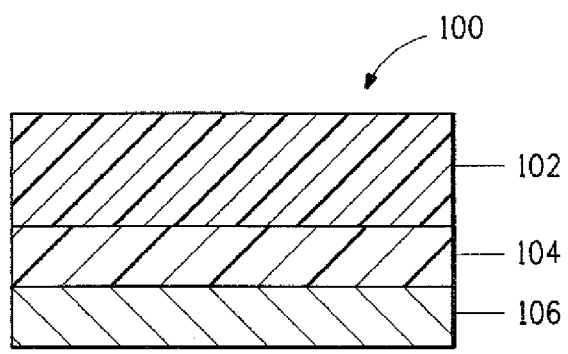
FIG. 2A is a cross-sectional view of a thermal imaging donor 100 comprising an interlayer layer 104.
Figure 2B:
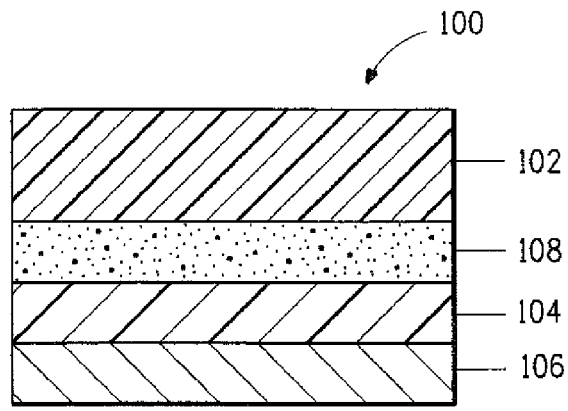
FIG. 2B is a cross-sectional view of a thermal imaging donor comprising a LTHC layer 108 interposed between base film 102 and an interlayer 104.

In one embodiment, the donor includes an interlayer (104) interposed between the base film and the dielectric transfer layer as shown in FIG. 2A. Another donor includes an interlayer (104) interposed between the LTHC layer and the dielectric transfer layer as shown in FIG. 2B. Typical functions and requirements of the interlayer are described in U.S. Pat. No. 6,228,555 B1 together with materials suitable for use as interlayers. The interlayer can be used, for example, to minimize damage and contamination of the transferred portion of the dielectric transfer layer. Preferred materials for the interlayer herein are thermoset polymers selected from the group consisting of: crosslinked or crosslinkable poly(meth)acrylates, polyesters, epoxies, and polyurethanes; and thermoplastic polymers selected from the group: poly(meth)acrylates, polystyrenes, polyurethanes, polysulfones, polyesters, polyimides, and ethylene copolymers including ethylene-norbornene copolymers. It is preferred that the thermoplastic polymers have a Tg greater than about 70° C., more preferably greater than about 100° C., and most preferably greater than about 130° C., and a $M_w$ greater than about 50,000 and more preferably greater than about 100,000. The thermoset polymers may be coated onto the LTHC layer as, for example, thermoplastic precursors and subsequently crosslinked to form a crosslinked interlayer. Preferred interlayers herein comprise a thermoset polymer, or a thermoplastic polymer with a Tg greater than about 70° C., and are characterized by greater than 80% transmission in the 600 nm to about 1200 nm wavelength region.

Multilayer Dielectric Transfer Layers and Cover Layers

Figure 3A:
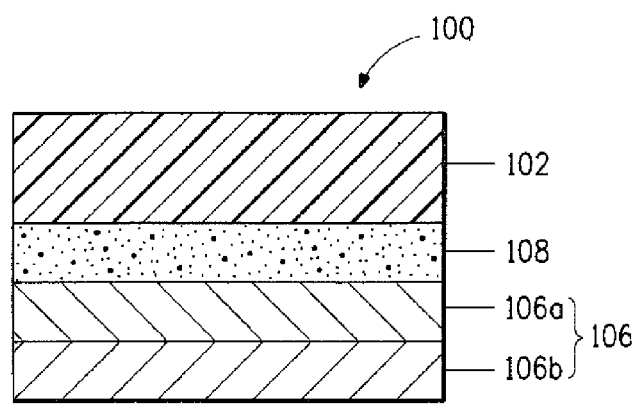
FIGS. 3A, 3B and 3C are cross-sectional views of thermal imaging donors 100 comprising multiple dielectric transfer layers.

In another preferred embodiment, the dielectric transfer layer comprises two or more Layers A that are gradient dye layers as described above. FIG. 3A illustrates this embodiment, wherein dielectric layers 106A and 106 B are gradient dye layers comprising different loadings of near-IR dye.

Figure 3B:
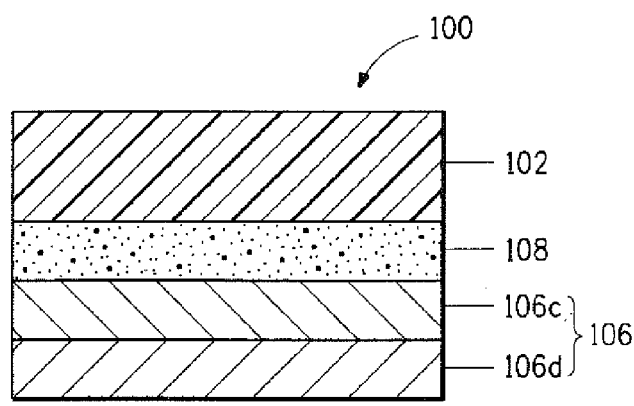

In another preferred donor of the invention, the dielectric transfer layer comprises two or more Layers A that are gradient nanoparticle layers as described above. FIG. 3B, illustrates this embodiment wherein dielectric layers 106C and 106D are gradient nanoparticle layers comprising different loadings of nanoparticles.

In another preferred donor of the invention the dielectric transfer layer comprises two or more layers of Layers A that are gradient layers with respect to both near-IR dye loading and high κ nanoparticle fraction, within the limits described above.

Figure 3C:
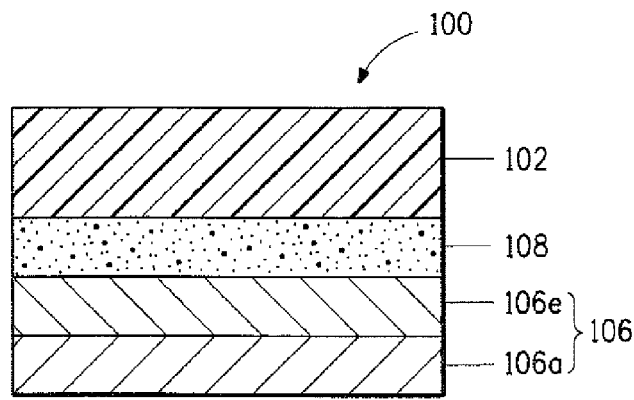

Another preferred donor of the invention, illustrated in FIG. 3C, includes a dielectric transfer layer comprising a Layer A 106A and one or more additional dielectric Layer(s) B 106E, comprising one or more dielectric polymer(s) having a resistivity of about $10^{14}$ ohm-cm or greater.

The multilayer thermal imaging donor can be prepared by coating respective layers onto a suitable base film. A wide variety of coating methods can be used including those described above for preparation of the dielectric layers.

Optionally, a protective strippable cover layer may be present on the outmost layer of the thermal transfer donor. The cover layer protects the underlaying transfer layers and is easily removable. A preferred cover sheet is polyethylene film.

Receivers and Imaging Process

The thermal transfer donors are useful in thermal transfer patterning of one or more dielectric layer(s) onto a thermal imaging receiver to provide a patterned dielectric layer(s) using a thermal transfer process.

Figure 4:
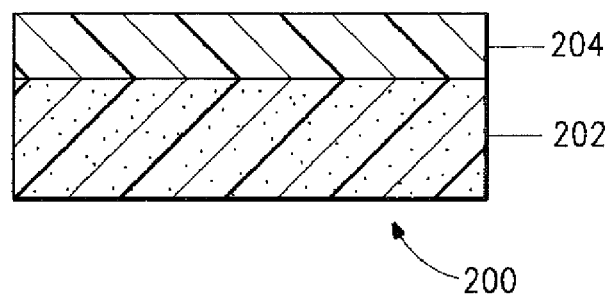
FIG. 4 is a cross-sectional view of a thermal imaging receiver 200 comprising a receiver base film 202 and optional adhesive layer 204.

FIG. 4 is a cross-sectional view of a thermal imaging receiver 200 that comprises a receiver base film 202 and optional image receiving layer 204. The receiver base film 202 comprises a dimensionally stable sheet material as defined for the base film of the thermal imaging donor. Additionally, the receiver base film can be an opaque material, such as polyethylene terephthalate filled with a white pigment such as titanium dioxide; ivory paper; or synthetic paper, such as Tyvek® spunbonded polyolefin. The sheet material can also be glass. Preferred base films for receivers are polyethylene terephthalate, polyethylene naphthalate, polyimide, triacetyl cellulose, and glass. The optional image receiving layer 204 facilitates adhesion of the thermal imaging receiver 200 to the thermally imaged transfer layer 106. Suitable image receiving layers 204 comprise a broad range of polymers including any of the (co)polymers/co(oligomers)/resins mentioned above in the description of the dielectric layer(s). Typical polymers for the receiver layer are (meth)acrylic polymers, including (meth)acrylate homopolymers and copolymers, (meth)acrylate block copolymers, and (meth)acrylate copolymers containing other comonomer types, such as styrene. The receiver element may optionally include one or more additional layers between the receiver support and the image receiving layer including release layers, cushion layers and adhesive layers. Receiving elements suitable for use herein are disclosed as transfer elements in U.S. Pat. No. 5,565,301 and as receiver elements in WO 03/099574, both of which are hereby incorporated by reference. Alternate receiver elements are disclosed in U.S. Pat. No. 5,534,387, hereby incorporated by reference. Preferred cushion layers herein are ethylene vinylacetate copolymers (Elvax® copolymers, DuPont). Methods of roughening the receiver surface are described in WO 03/009574. A preferred roughening method herein is to bring the receiver surface in contact with a roughened sheet, typically under pressure and heat.

The various embodiments of the thermal imaging donors are useful in formation of patterned dielectric layers for electronic devices such as displays and touchpads. To image the thermal imaging donor, the donor is contacted with a thermal imaging receiver. By contacted is meant that the donor is in close proximity, preferably within several microns, of the receiver. In some embodiments, when contacted, there is no detectable distance between the donor and receiver. The receiver may be off-set from the donor by, for example, previously printed layers, fibers or particles that act as spacers to provide a controlled gap between donor and receiver. Vacuum and/or pressure can be used to hold the donor element 100 and the receiver element 200 together. As one alternative, the donor element 100 and the receiver element 200 can be held together by fusion of layers at the periphery of the assembly.

At least a portion of the one or more dielectric transfer layer(s) is transferred to the thermal imaging receiver by thermal transfer to form a patterned dielectric layer(s). Wherein the dielectric transfer layer comprises one or more additional dielectric layer(s), a corresponding proximate portion of the additional dielectric layer(s) is transferred in the transfer process. Preferably the thermal transfer is a laser-mediated transfer process. In one embodiment, the assembly of the donor element 100 and the receiver element 200 is selectively exposed to heat, which is preferably in the form of laser radiation, in an exposure pattern of the image of the desired pattern to be formed on the substrate. The laser radiation is focused about at the LTHC layer, or if the LTHC layer is not present, at about the interface between those layers to be transferred and those to remain with the donor. Sufficient radiation is applied to achieve transfer of the desired transfer layers to the receiver.

A variety of light-emitting sources can be used to heat the thermal transfer donor elements. For analog techniques (e.g., exposure through a mask), high-powered light sources (e.g., xenon flash lamps and lasers) are useful. For digital imaging techniques, infrared, visible, and ultraviolet lasers are particularly useful. Other light sources and irradiation conditions can be suitable based on, among other things, the donor element construction, the transfer layer material, the mode of thermal transfer, and other such factors.

The radiation is preferably applied through the backside of base film 102, that is, the side opposite the dielectric transfer layer(s). Laser radiation is preferably provided at a laser fluence of up to about 600 mJ/cm$^2$, more preferably about 75-440 mJ/cm$^2$. Lasers with an operating wavelength of about 350 nm to about 1500 nm are preferred. Particularly advantageous are diode lasers, for example those emitting in the region of about 750 to about 870 nm and up to 1200 nm. Such lasers are available from, for example, Spectra Diode Laboratories (San Jose, Calif.). One device used for applying an image to the receiver is the Creo Spectrum Trendsetter 3244F, which utilizes lasers emitting near 830 nm. This device utilizes a Spatial Light Modulator to split and modulate the 5-50 Watt output from the ~830 nm laser diode array. Associated optics focus this light onto the imageable elements. This produces 0.1 to 30 Watts of imaging light on the donor element, focused to an array of 50 to 240 individual beams, each with 10-200 mW of light in approximately 10×10 to 2×10 micron spots. Similar exposure can be obtained with individual lasers per spot, such as disclosed in U.S. Pat. No. 4,743,091. In this case each laser emits 50-300 mW of electrically modulated light at 780-870 nm. Other options include fiber-coupled lasers emitting 500-3000 mW and each individually modulated and focused on the media. Such a laser can be obtained from Opto Power in Tucson, Ariz.

Suitable lasers for thermal imaging include, for example, high power (>90 mW) single mode laser diodes, fiber-coupled laser diodes, and diode-pumped solid state lasers (e.g., Nd:YAG and Nd:YLF). Laser exposure dwell times can vary widely from, for example, a few hundredths of microseconds to tens of microseconds or more, and laser fluences can be in the range from, for example, about 0.01 to about 5 J/cm$^2$ or more.

Figure 5A:
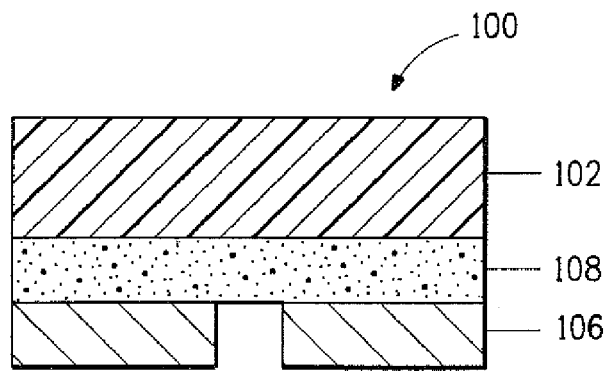
FIGS. 5A and 5B illustrate the donor 100 and receiver 200 after transfer of an exposed portion of the dielectric transfer layer.
Figure 5B:
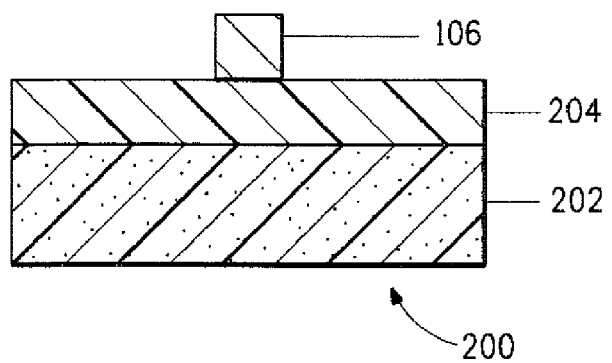
Figure 6:
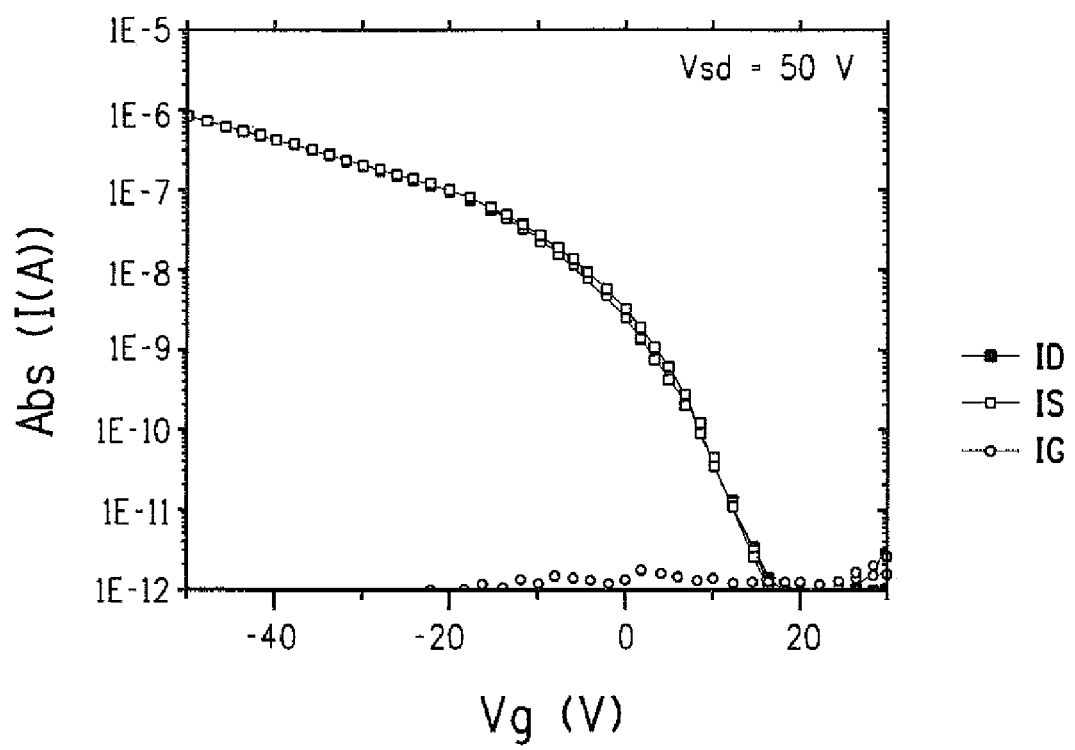
FIG. 6 illustrates the current versus gate voltage sweep with drain voltage equal −50 V for the transistor made with the dielectrics layers according to one embodiment of the invention.

After exposure, the donor element 100 and the receiver element 200 are separated, as illustrated in FIGS. 5A and 5B, leaving the untransferred portions of the dielectric layer 106 on the donor element 100 and the patterned dielectric layer on the receiver element 200. Usually the separation of the donor and receiver is achieved by simply peeling the two elements apart. This generally requires very little peel force and is accomplished by simply separating the donor element from the receiver element. This can be done using any conventional separation technique and can be manual or automatic.

In some instances, depending upon the nature of the donor and receiver elements and the transfer processing parameters, when the donor element and the receiver element are separated after thermal transfer, the receiver element includes both exposed portions and some non-exposed portions of one or more transfer layers. A useful process for enhancing the resolution of a thermally transferred pattern on a thermal transfer receiver, wherein the thermal transfer receiver comprises a surface having an exposed portion and a non-exposed portion, of one or more thermally transferred layers, comprises: (a) contacting the surface with an adhesive layer for a contact period to provide a laminate; (b) separating said adhesive layer from the laminate to provide a treated thermal transfer receiver having a surface substantially free of said non-exposed portion of one or more thermally transferred layers.

Non-exposed portions of one or more thermally transferred layers can be in the form peel defects, defined herein as non-exposed portions of an imaged layer that are transferred onto the receiver along with the exposed portion of the layer. These peel defects are typically relatively weakly adhered to the receiver as compared to the exposed portions of the image. Minimization and absence of these peel defects can be achieved by optimization of donor formulations, tuning of donor drying times and temperatures, control of the temperature and relative humidity of the printing room, and by selection of the receiver and tuning of its surface through various surface treatments. The peel defects can often be selectively removed by brief contact with an adhesive surface. Contact periods are about from 0.01 seconds to minutes, preferably 1 second to 10 minutes, more preferably 1-90 seconds. Preferred adhesive surfaces include polymer- and metal-coated surfaces. Examples of such adhesive surfaces are Scotch® tape (3M Company), a tacky roller such as a medium tack Dust Removal System-1 roller (Systems Division, Inc., Irvine Calif.), the dielectric donor and receiver substrates reported herein, most preferably the acrylic latex-based donor and receiver substrates, and the LTHC layer donor substrates reported herein, preferably the metallized LTHC donor substrates.

Either or both of the spent donor element (a negative of the image) and the imaged receiver element (a positive of the image) may be useful as a functional object. Furthermore, either or both of the spent donor element and the imaged receiver element may be utilized as the permanent substrate or the image may be transferred from the spent donor or receiver, preferably by lamination, to the permanent substrate. The donors of the invention can be used to prepare patterned dielectric layers characterized by a resistivity of $10^{14}$ ohm-cm or greater.

Various electrical elements that can be formed, at least in part, by the use of the present invention include electronic circuitry, resistors, capacitors, diodes, rectifiers, electroluminescent lamps, memory elements, field effect transistors, bipolar transistors, unijunction transistors, thin film transistors, metal-insulator-semiconductor stacks, organic transistors, charge coupled devices, insulator-metal-insulator stacks, organic conductor-metal-organic conductor stacks, integrated circuits, photodetectors, lasers, lenses, waveguides, gratings, holographic elements, filters (e.g., add-drop filters, gain-flattening filters, cut-off filters, and the like), splitters, couplers, combiners, modulators, sensors (e.g., evanescent sensors, phase modulation sensors, interferometric sensors, and the like), optical cavities, piezo-electric devices, ferroelectric devices, thin film batteries, or combinations thereof; for example, the combination of field effect transistors and organic electroluminescent lamps as an active matrix array for an optical display.

Materials

Unless otherwise indicated, chemicals were used as received without further purification. Solvents were purchased from Aldrich and VWR and were of reagent-grade purity or higher; HPLC grade and preferably electronic grade solvents were used when available. Water was deionized water, HPLC grade water from Aldrich, or purified water. Polymers, plasticizers, IR dyes, and surfactants were obtained from the sources listed in the specification or purchased from Aldrich. Pigments such as carbon black dispersions were obtained from Penn Color, Inc., Doylestown, Pa. All raw polyester films were obtained from DuPont Teijin Films (Wilmington, Del.). Silver nanoparticles were purchased from Ferro Co.—Electronic Material Systems; Nanostructured & Amorphous Materials, Inc., and Mitsui Co. HiPco raw carbon nanotubes were purchased form Carbon Nanotechnologies, Inc., Houston Tex. Kapton HN was obtained from DuPont De Nemours, Inc. (Circleville, Ohio). WPTS® 3737 (Water-Proof Transfer Sheet) was obtained from DuPont De Nemours, Inc. (Towanda, Pa.). Strontium titanate, barium titanate, and barium-strontium titanate nanoparticles (~50 nm) were purchased from Aldrich (Milwaukee, Wis.), TPL (Albuquerque, N. Mex.), and Cabot Corporation (Boston, Mass.).

Coating

Coating of transfer and other layers onto donor and receiver elements was carried out utilizing stainless steel wrapped and formed 0.5 inch diameter coating rods purchased from R.D. Specialties, Inc. (RDS; Webster, N.Y.) and chrome-plated stainless steel formed 0.625 inch diameter rods with a CN profile purchased from Buschman Corporation (Cleveland, Ohio). The free surface of the donor was cleaned with a pressurized nitrogen stream immediately prior to coating to rid the surface of particle contamination. The coatings were drawn by hand on the donor mounted on a smooth glass surface or machine-coated utilizing a Water-Proof® Color Versatility coating system (CV coater) manufactured by DuPont De Nemours Inc. (Wilmington, Del.).

Coatings were stored in a controlled temperature/humidity environment with an average temperature of about 68° C. and about 40-50% average relative humidity.

Donor Substrates

Cr LTHC Layer.

A base film of polyethylene terephthalate (PET, 50 microns thick in all examples unless stated otherwise) was coated with chrome metal in a vacuum deposition chamber. Metallization was carried out on PET films with and without light attenuating agents (670 nm absorbers). The chrome layer was coated at both 50% T and 40% T. In the examples, these donor films will be referred to as: 40% T Cr PET donor substrate and as 50% T Cr PET donor substrate; for the metallized films without light attenuating agents. The donor films with 670 nm absorbers incorporated in the base film will be referred to as: 40% T Cr Blue PET donor substrate and as 50% T Cr Blue PET donor substrate.

Ni LTHC Layer.

A process similar to that given for Cr above was carried out for preparing donors with 50% T Ni LTHC layers. Instead of incorporating a light-attenuating agent in the base film, a 1% solution of Methylene Blue (MB; Aldrich) in methanol was coated on the back-side of the donor substrate (the side opposite the LTHC layer) according to the following procedure: The 50% T Ni PET donor substrate (20 cm by 30 cm) was placed on a flat sheet of glass with the LTHC layer facing down. The methylene blue solution (~3 mL) was dispensed from a syringe through a 0.45 micron pore-size filter along one short edge of the donor. Using a #4 formed stainless steel RDS coating rod, the bead of solution was hand-drawn into a thin film covering the back-side of the thermal imaging substrate. The film was air-dried. This donor substrate will be referred to herein as 50% T Ni PET-MB donor substrate.

Organic LTHC Layer.

The organic LTHC layer was prepared as reported in Formulation L of the Examples of PCT/US05/38009:

A LTHC coating formulation was prepared from the following materials: (i) demineralized water: 894 g; (ii) dimethylaminoethanol: 5 g; (iii) Hampford dye 822 (Hampford Research; formula corresponds to SDA 4927): 10 g; (iv) polyester binder (Amertech Polyester Clear; American Inks and Coatings Corp; Valley Forge; PA): 65 g of a 30% aqueous solution; (v) TegoWet™ 251(4) (a polyether modified polysiloxane copolymer, Goldschmidt): 2.5 g; (vi) potassium dimethylaminoethanol ethyl phosphate: 14 g of an 11.5% aqueous solution [The 11.5% aqueous solution was prepared by combining three parts water and 0.5 parts ethyl acid phosphate (Stauffer Chemical Company, Westport, Conn.: Lubrizol, Wickliffe, Ohio) and sufficient 45% aqueous potassium hydroxide to achieve a pH of 4.5, followed by addition of sufficient dimethylaminoethanol to achieve a pH of 7.5 and finally dilution with water to achieve five parts total of final aqueous solution of 11.5 relative mass percent of water-free compound.]; (vii) crosslinker Cymel™ 350 (a highly methylated, monomeric melamine formaldehyde resin, Cytec Industries Inc., West Paterson, N.J.): 10 g of a 20% solution; and (viii) ammonium p-toluene sulphonic acid: 2 g of a 10% aqueous solution.

Ingredients (ii) and (iii) were added to the water and allowed to stir for up to 24 hours before addition of the other ingredients in the order shown. The formulation was applied in an in-line coating technique as follows: The polymer base film composition was melt-extruded, cast onto a cooled rotating drum and stretched in the direction of extrusion to approximately 3 times its original dimensions at a temperature of 75° C. The cooled stretched film was then coated on one side with the LTHC coating composition to give a wet coating thickness of approximately 20 to 30 μm. A direct gravure coating system was used to apply the coatings to the film web. A 60QCH gravure roll (supplied by Pamarco) rotated through the solution, taking solution onto the gravure roll surface. The gravure roll rotated in the opposite direction to the film web and applied the coating to the web at one point of contact. The coated film was passed into a stenter oven at a temperature of 100-110° C. where the film was dried and stretched in the sideways direction to approximately 3 times its original dimensions. The biaxially stretched coated film was heat-set at a temperature of about 190° C. by conventional means. The coated polyester film was then wound onto a roll. The total thickness of the final film was 50 microns; the dry thickness of the LTHC layer was 0.07 microns. The PET support layer contained either Disperse Blue 60 or Solvent Green 28 dye to give a final dye concentration of typically 0.2% to 0.5% by weight in the polymer of the substrate layer. The polymer composition containing the Disperse Blue 60 dye (0.26% by weight) had an absorbance of 0.6±0.1 at 670 nm, and an absorbance of <0.08 at 830 nm. The polymer composition containing the Solvent Green 28 dye (0.40% by weight) had an absorbance of 1.2 at 670 nm, and an absorbance of <0.08 at 830 nm. These donor substrates will herein be referred to as: Organic LTHC Blue PET donor substrate and Organic LTHC Green PET donor substrate.

WPTS®:

WaterProof® Transfer Sheet (WPTS® 3737; DuPont, Towanda) was used as the donor substrate for laminations. Immediately prior to coating on this substrate, the polyethylene coversheet was removed to expose the release layer of the WPTS° sheet. The coating was applied on this release layer.

Dielectric Measurements

Dielectric electrical properties were tested by spin-coating solvent-based dielectrics or laminating (unless spin-coating is specified) aqueous-based dielectrics from WPTS° onto a glass substrate pre-patterned with ten aluminum "fingers". A top aluminum electrode was then evaporated over the central portion of the substrate to form ten small capacitor structures. Alternatively, if "ITO Method" is specified, the dielectric was rod-coated on the ITO sputtered surface of a PET substrate [700 mil Melinex® ST504 film (DuPont Teijin Films) with ITO sputtered on the non-treated side by Courtalds with 0050 (50 ohm/square)] using a Buschman 7CN rod and a CV coater, and ten aluminum fingers were evaporated onto the free surface of the dielectric.

The dielectric constant was determined by measuring the complex admittance from 40 Hz to 110 MHz with an Agilent 4294 impedance bridge. The bulk resistivity was measured by applying a small dc voltage across the device (typically <5 V) and measuring the current through the film with a sensitive preamplifier. Care was taken to confine the measurement to the linear part of the I-V curve before space charge limited currents dominate.

Transistor Electrical Characterization

Transistor electrical performance was measured in air at room temperature using common techniques, for example as shown in S. M. Sze, *Physics of Semiconductor Devices*, page 442, John Wiley and Sons, New York, 1981. A Cascade MicroTech (Beaverton, Oreg.) probestation model Alessi REL-6100 and a semiconductor parameter analyzer Agilent Technologies (Palo Alto, Calif.) model 4155C were used to obtain current versus gate voltage sweeps at constant drain voltage. Typically, gate voltage was swept from +30 to −50 V with a constant source-to-drain bias of −50 V. A plot of square root of current versus gate voltage, at constant drain voltage, was used to determine the saturation mobility. The slope of the straight line portion of the plot was used to define the transconductance. From the transconductance, the device width and length, and the specific dielectric capacitance, the transistor saturation mobility was calculated.

Thermal Imaging Equipment and Donor Mounting

Creo Trendsetter® 800 was utilized. The Creo Trendsetter® 800 was a modified drum-type imager utilizing a modified Thermal 1.7 Head with a 12.5 watt maximum average operating power at a wavelength of 830 nm with 5080 dpi resolution. The 800 Trendsetter® was operated in a controlled temperature/humidity environment with an average temperature of ~68° C. and an average relative humidity of ~40-50%. For each printing experiment, a section of thermal imaging receiver was positioned on the drum. The thermal imaging donor was loaded so that the side of the donor element coated with the transfer layer was facing the free side of the receiver. Imaging assemblages were exposed from the back side through the donor film base. Films were mounted using vacuum hold down to a standard plastic or metal carrier plate clamped mechanically to the drum. In some experiments utilizing the Creo Trendsetter® 800, a nonstandard drum with vacuum holes machined directly onto the drum to match common donor and receiver sizes was used as a replacement for the standard drum/carrier plate assemblage. Contact between the donor and receiver was established by ~600 mm of Hg vacuum pressure. Laser output was under computer control to build up the desired image pattern. Laser power and drum speed were controllable and were adjusted in an iterative fashion to optimize image quality as judged by visual inspection of the transferred image on the receiving surface.

Latex Binder Preparation

Latex binders that were used in the preparation of certain donor and receiver elements were prepared according to the procedures of WO 03/099574 with the materials reported in Table 1. Compositions are reported in Table 2 and were characterized by the analytical methods reported in WO 03/099574. Monomers and initiators were commercially available (Aldrich Chemical Co., Milwaukee, Wis.) and used as received. The surfactant was Polystep® B-7, a 29 wt % solution of ammonium lauryl sulphate in water (Stepan Co., Northfield, Ill.).

Chain Transfer Agent: This material was prepared as described in U.S. Pat. No. 5,362,826, Berge, et. al.: A 500 liter reactor was equipped with a reflux condenser and nitrogen atmosphere. The reactor was charged with methyl ethyl ketone (42.5 kg) and isopropyl-bis(borondifluorodimethylglyoximato) cobaltate (III) (Co III DMG) (104 g) and the contents brought to reflux. A mixture of Co III DMG (26.0 g), methyl methacrylate (260 kg), and methyl ethyl ketone (10.6 kg) was added to the reactor over a period of 4 hours. Starting at the same time, a mixture of Vazo 67® (DuPont, 5.21 kg) and methyl ethyl ketone (53.1 kg) was added to the reactor over a period of 5 hours. After the additions, the reactor contents were kept at reflux for another ½ hour. After cooling, this yielded 372 kg of a 70 wt % solution of Chain Transfer Agent (a chain transfer agent solution), which was used directly in the polymerizations.

Receivers

Kapton® HN (5 mil; E.I. duPont de Nemours Co.) substrate was cleaned prior to use as a receiver by rinsing with methanol, wiping with a particle free cloth, and blowing off with a dry nitrogen stream. Surface-treated 5 mil Melinex® ST504 (DuPont Teijin Films) was used as received.

R-1, R-2 and R-3 PET receivers with an acrylic latex image receiving layer were prepared according to the procedure of WO 03/099574 (Flexible Receiver FR-1 Procedure) by slot-die coating an acrylic latex polymer dispersion with Zonyl® FSA as the surfactant onto 4 mil Melinex® 574 base film (DuPont-Teijin Films) or onto 4 mil Cronar® 471X (DuPont-Teijin Films) with an Elvax® 550 (ethylene vinyl acetate copolymer, DuPont) release layer between the acrylic image receiving layer and the Cronar® base film (Cronar®/Elvax®: WPTS®, DuPont). The preparation and compositions of the acrylic latex polymers are described above, and the receiver compositions are reported in Table 3.

TABLE 1

Materials for the Synthesis of Acrylic Latex Resins

| Reagent (grams) | LH-3 | LL-3 | LH-1 | LL-1 | LH-0 | LL-0 | LHEA-6 | LL-3-2GA | LH-3-2GA | LH-10-2GA |
|---|---|---|---|---|---|---|---|---|---|---|
| Polystep B-7 | 6.90 | 6.90 | 6.90 | 6.90 | 6.90 | 6.90 | 6.90 | 6.90 | 6.90 | 6.90 |
| Ammonium Persulfate | 0.40 | 0.20 | 0.20 | 0.20 | 0.40 | 0.20 | 0.20 | 0.40 | 0.40 | 0.40 |
| Methyl Methacrylate | 252.0 | 228.0 | 260.0 | 236.0 | 264.0 | 240.0 | 240.0 | 220.0 | 280.0 | 192.0 |
| Butyl Acrylate | 120.0 | 160.0 | 120.0 | 160.0 | 120.0 | 160.0 | 120.0 | 160.0 | 100.0 | 100.0 |
| Methacrylic Acid | 12.00 | 12.00 | 4.00 | 4.00 | 0 | 0 | 0 | 12.00 | 12.00 | 40.00 |
| Glycidyl Methacrylate | 0 | 0 | 0 | 0 | 0 | 0 | 0 | 8.00 | 8.00 | 8.00 |
| HEMA | 0 | 0 | 0 | 0 | 0 | 0 | 24 | 0 | 0 | 0 |
| Chain Transfer Soln | 16.0 | 0 | 16.0 | 0 | 16.0 | 0 | 16.0 | 0 | 0 | 0 |

HEMA: 2-Hydroxyethyl Methacrylate.

TABLE 2

Composition and Analytical Data for Latex Resins

| Resin | Solids | Chain Transfer Soln | MMA | BA | MAA | HEMA | GMA | Particle Diameter (nm) | Tg (° C.) | Mn/1000 | Mw/1000 |
|---|---|---|---|---|---|---|---|---|---|---|---|
| LH-3 | 32.6 | 4 | 63 | 30 | 3 | | | 75 | 56 | 57 | 135 |
| LL-3 | 33.3 | 0 | 57 | 40 | 3 | | | 93 | 33 | 244 | 1399 |
| LH-1 | 33.5 | 4 | 65 | 30 | 1 | | | 78 | 53 | 57 | 138 |
| LL-1 | 33.4 | 0 | 59 | 40 | 1 | | | 93 | 34 | 235 | 1539 |
| LH-0 | 32.8 | 4 | 66 | 30 | 0 | | | 70 | 53 | 53 | 145 |
| LL-0 | 33.4 | 0 | 60 | 40 | 0 | | | 92 | 34 | 69 | 341 |
| LHEA-6 | 32.6 | 4 | 60 | 30 | 0 | 6 | | 71 | 50 | 57 | 150 |
| LL-3-2GA | 33.4 | 0 | 55 | 40 | 3 | | 2 | 94 | 39 | | |
| LH-3-2GA | 33.5 | 0 | 70 | 25 | 3 | | 2 | 92 | 72 | | |
| LH-10-2GA | 33.5 | 0 | 48 | 40 | 10 | | 2 | 86 | 59 | | |

MMA: Methyl Methacrylate;
BA: Butyl Acrylate;
MAA: Methacrylic Acid;
HEMA: 2-Hydroxyethyl Methacrylate;
GMA: Glycidyl Methacrylate.

TABLE 3

| Receiver | R-1 | R-2 | R-3 |
|---|---|---|---|
| Receiver Material | | | |
| LH-3-2GA (33% Solids) | 2173 g | 2607.6 | — |
| LL-3-2GA (33% Solids) | 3259 g | 3910.8 | — |
| LH-10-2GA (33% Solids) | — | — | 12574.0 |
| N,N-Dimethyl-ethanolamine (10% in water) | 75.0 g | 90.0 | 109.6 |
| Water (distilled) | 8713 g | 10455.6 | 221868.0 |
| Zonyl FSA | 30.0 g | 36.0 | 43.2 |
| Butyl Cellosolve | 750 g | 900.0 | 1106.0 |
| % Solids | 12% | 12% | 11.6% |
| Coating Weight | 13 mg/dm2 | 12.9 mg/dm2 | |
| Receiver | 4 mil Melinex ® 574 | 1.25 mil Elvax ® 550/ Cronar ® 471X | 2.5 mil Elvax ® 550/ Cronar ® 471X |
| Polyethylene Cover Sheet | No | Yes | Yes |

General Procedure for the Preparation of Aqueous Dielectric Layers

A water solution was prepared by combining the specified amounts of water and, optionally, a 3 wt % ammonium hydroxide solution. Next, the IR dye, one-fourth of the water solution, and optional defoamers, surfactants and plasticizers were combined in a brown glass container and mixed well. The optional second binder was weighed in a container together with one-fourth of the water solution and mixed well. Optional filler(s) (e.g., carbon black, high κ nanoparticles) were weighed in another container with one-fourth of the water solution and mixed well. The binder was weighed in a large container with a stir bar and any remaining water solution was added. The contents of the second binder dispersion, the IR dye dispersion, and the filler dispersion were slowly added to the stirring binder. After stirring for at least 15 additional minutes, the formulation was filtered into a brown or foiled-coated container. The solution was filtered for a second time as it was syringed across the end of a donor sheet and was then coated. Unless specified otherwise, filtrations were carried out with 0.45 micron pore size syringe filters (25 mm GD/X Glass Microfiber GMF filter Whatman Inc., Clifton, N.J.), and coatings were carried out using a CV coater with a Buschman Rod 7CN at 9.8 ft/min. Typically, 17.95 total wt % solids solutions were utilized to give films with a thickness of ~2.3 microns.

General Procedure for the Preparation of Solvent-Based Dielectrics

The specified amounts of polymer, IR dye, plasticizer, solvents and other additives were weighed together in a brown vial. The vial was then capped with a lid and shaken vigorously on a mechanical shaker for 3 to 24 h. The solution was then filtered into a brown vial. The solution was filtered for a second time as it was syringed onto the edge of a donor sheet and was then coated. Unless specified otherwise, filtrations were carried out with 0.45 micron pore size syringe filters (25 mm GD/X Glass Microfiber GMF filter), and coatings were carried out using a CV coater with a Buschman Rod 7CN at 9.8 ft/min.

Formulation and Coating of Pani-DNNSA-CNT Donors

Pani-3%-#12:

(3% HiPco CNT, Pani-DNNSA) A mixture of HiPco Raw CNT (0.0450 g), xylenes (19.680 g) and PANI-DNNSA [5.333 g, 27.30% by wt. in xylenes and 2-butoxyethanol (4:1 ratio) with 0.7 acid doping, synthesized according to U.S. Pat. No. 5,863,465] was treated in a rt water sonication bath for 1 h. Then the mixture was placed in a 45° C. water bath for 5 min. After equilibration of the temperature, the mixture was treated with a sonication probe (Dukane Co. Model 40TP200, Transducer Model 41C28) for 3 min, during which time the mixture was stirred gently with a spatula at one-minute intervals. The dispersion (2.3 mL) was hand-coated onto a 40% T Cr PET donor substrate (~30 cm×20 cm) with a #12 formed Buschman rod, dried at rt and then further dried at 70° C.

Pani-3%-#14:

The above procedure was followed except using a #14 rod.

Pani-7%:

(7% HiPco CNT, Pani-DNNSA) A mixture of HiPco Raw CNT (0.1225 g), Disperbyk® 163 (0.066 g, BYK Chemie) and xylenes (27.612 g) was treated in a rt water bath with a sonication probe (Dukane Co. Model 40TP200, Transducer Model 41C28) for 10 min, during which time the mixture was stirred gently with a spatula at 5 min intervals. Then PANI-DNNSA [7.327 g, 24.23% by wt. in xylenes and 2-butoxyethanol (4:1 ratio) with 0.7 acid doping, synthesized according to U.S. Pat. No. 5,863,465] was added into the mixture, and the mixture was placed in a 45° C. water bath for 5 min. After equilibration of the temperature, the mixture was treated with sonication for 5 min, during which time the mixture was stirred gently with a spatula at one-minute intervals. The resulting dispersion was filtered through a 1.0 micron Nitex® 03-1/1 nylon screen (mesh count 690×470, pore size: 1 micron; Sefar America Inc., Depew, N.Y.). Into the filtrate was added 28.8 micro-L of a 10 wt % solution of Triton® X-114 in xylenes. The dispersion (13 mL) was coated onto a 40% T Cr PET donor substrate using a CV coater at 5.8 ft/min with a #10 CN formed Buschman rod and dried at 40° C. for 15 min.

Modified Pani-7% (mPani-7%):

The following CNT-PANI donors were prepared according to the procedure for Pani-7%, except that a mixed solvent system [1,2-dichlorobenzene (DCB) and xylenes] was used: mPani-7%-a: 10% DCB; mPani-7%-b: 20% DCB; mPani-7%-c: 30% DCB.

Formulation and Coating of Silver Donors

Ag/Elv-#8:

(87.5% NAM 0471CD Ag with Elvacite® 2028) A mixture of 0471 CD Ag powder (10.497 g), a 20 wt % solution of Elvacite® 2028 in xylenes (7.512 g), and xylenes (12.006 g) was treated in a water bath with sonication for 1 h, during which time the mixture was stirred with a spatula at 0.5-h intervals. The mixture was then treated in a rt water bath with probe sonication for an additional 10 min, during which time the mixture was stirred gently with a spatula at 5-min intervals. The resulting dispersion was filtered with a 12 micron stainless screen (Twill Dutch Weave, mesh count 200×1400, absolute rating: 12-14 microns; Sefar America, Inc., Depew, N.Y.). The dispersion (10 mL) was coated onto a 40% T PET donor substrate using a CV coater at 5.8 ft/min using a #8 formed Buschman rod and dried at 33° C. for 15 min.

Aq/Elv-CN6:

Above procedure was followed except using CN6 rod.

Aq/Elv-CN7:

Above procedure was followed except using a CN7 rod.

Aq/Elv-CN8:

Above procedure was followed except using a CN8 rod.

mAq/Elv-CN8:

Above procedure was followed except using a CN8 rod and a modified solvent mixture of 50% DCB and 50% xylenes.

mAq/Elv-CN7:

Above procedure was followed except using a CN7 rod and modified (longer) dispersion times: an extra 15 min before and an extra 5 min at the end of the sonication bath.

Ag/Elv/CNT-#8:

(1% CNT and 87.5% Ag NAM 0471 CD with Elvacite® 2028) A mixture of CNT (HiPco R0447, 0.0121 g), 1,2-dichlorobenzene (6.030 g) and xylenes (6.019 g) were dispersed with probe sonication for 15 min, during which time the mixture was stirred with a spatula at 5 min intervals. Next, NAM 0471 CD Ag powder (10.503 g) and a 20 wt % solution of Elvacite® 2028 in xylenes (7.513 g) were added to the mixture, and the mixture was treated in a water bath with sonication for 1 h, during which time the mixture was stirred with a spatula at 0.5-h intervals. The mixture was then dispersed in a rt water bath with probe sonication for an additional 10 min, during which time the mixture was stirred gently with a spatula at 5-min intervals. The resulting dispersion was filtered with a 12 micron stainless screen (Twill Dutch Weave, mesh count 200×1400, absolute rating: 12-14 microns; Sefar America, Inc., Depew, N.Y.). The dispersion (10 mL) was coated onto a 40% T PET donor substrate using a CV coater at 5.8 ft/min with #8 formed Bushman rod and dried at 38° C. for 25 min.

mAq/Elv/CNT-#8:

The above procedure was followed with the following exceptions: A shot CNT from NAM was used and the coating was prepared with a CN#8 rod and dried for 30 min.

General Procedure for Semiconductor Evaporation

Shadow masks were fabricated from 2-4 mil thick nickel foil. Shadow mask alignment to the printed array was done by hand, using a light table and stereomicroscope. Careful manipulation of the printed array relative to the shadow mask allowed ~50 micron alignment over 6 inch arrays with minimal damage to the printed array. Once aligned, magnets were used to pinch the printed array and nickel shadow mask together and this was then reinforced with Kapton tape. Finally, the aligned mask/printed array was carefully rolled onto a vacuum deposition drum in a Kurt Lesker Evaporator and loaded for semiconductor evaporation. Semiconductor was deposited by sublimation under vacuum ($<3\times10^{-7}$ Torr) onto the free surface. The semiconductor was deposited with an initial rate of 0.1 Å/s up to 60 Å, and then at 0.5 Å/s until the desired thickness, typically 450 Å, was obtained, as determined by measurement with a quartz crystal microbalance. This procedure was carried out with pentacene and semiconductors SC-H1 and SC-H2.

General Procedure for Printing a Bottom—

Gate Transistor Array with Associated Capacitors and Bus Lines

The above general procedure for printing and mounting with a Creo Trendsetter® 800 (Creo/Kodak, Vancouver, Canada) thermal platesetter was followed for all printed layers. First, the receiver was loaded onto the drum along with the gate (first layer) donor. Following printing, the gate donor was peeled away from the receiver to give a receiver with a patterned gate layer consisting of patterns of gate electrodes, capacitor electrodes, bus lines and test pads. Next, the dielectric donor was loaded onto the drum, printed, and peeled away from the receiver to give a receiver with consecutively patterned gate and dielectric layers. The dielectric layer was either patterned or printed as a solid block. Next, the source-drain donor was loaded onto the drum, printed, and peeled away from the receiver to give a receiver with patterned gate, dielectric and source-drain layers. The source-drain layer consisted of patterns of source-drain electrodes, capacitor electrodes, bus lines and test pads.

Multilayer printed transistor arrays were designed using a standard photolithography software package (L-Edit) and then converted to a single postscript file for each layer. Each postscript file was then used for layer-by-layer printing in the Trendsetter. Three patterns were utilized in these examples with both solid and patterned dielectrics: (1) TFT Pattern 1: 150×15 micron source-drain channel; (2) TFT Pattern 2: 600×50 micron source-drain channel; and (3) TFT Pattern 3: 1350×50 micron source-drain channel. Next, the semiconductor was evaporated through a mask in the source-drain channel region according to the general procedure given above. The entire source-drain channel and surrounding region was covered with a rectangular patch of semiconductor in the case of Patterns 1 and 3. In the case of Pattern 2, a 450×400 micron patch of semiconductor was deposited in the channel region, to give a transistor with an effective channel of 450×50 microns.

EXAMPLES 1-19

PHS, PVA and Phenol-Aldehyde Dielectrics

Dielectric layers comprising poly(hydroxystyrene) [PHS], PHS copolymers, poly(vinyl acetate) [PVA] and phenol-aldehyde polymers [Novolac® resins] with resistivities greater than $10^{14}$ ohm-cm were prepared from the components reported in Tables A and B using the general procedure for

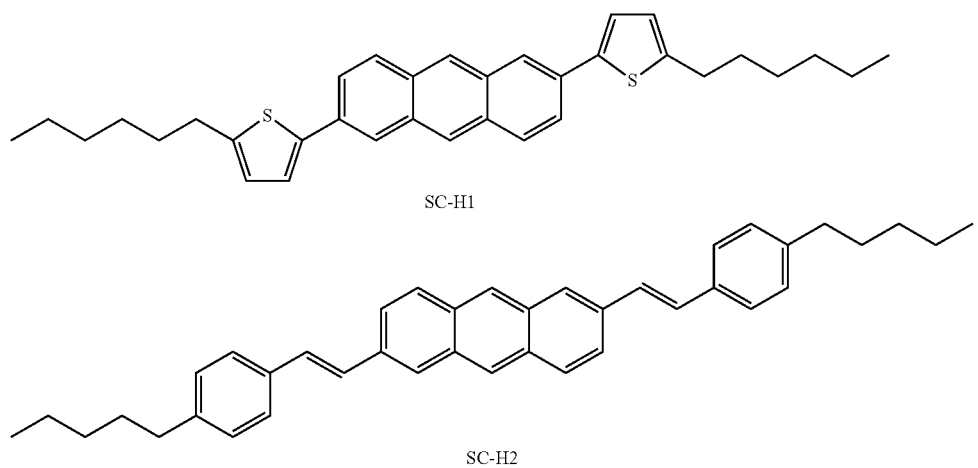

SC-H1

SC-H2 solvent-based dielectrics given above, and the thermal transfer of some of these dielectric layers is reported in Table C.

Donor Element Fabrication:

The thermal imaging donor substrate (30 cm by 20 cm; either 50% T Cr Blue PET or 50% T Ni PET-MB) was placed on a flat sheet of glass with the LTHC layer facing up. The dielectric solution (5 mL) was dispensed from a syringe through a 0.45 micron pore-size filter along one short edge of the donor (25 mm GD/X Glass Microfiber GMF, Whatman Inc.). Using a #7 formed stainless steel RDS coating rod, the bead of solution was hand-drawn into a uniform thin film covering the LTHC layer of the thermal imaging substrate. The film was air-dried, resulting in a dielectric layer on top of the LTHC layer.

Pani/CNT/DNNSA:

In the case of Examples 13 and 17, a receiver patterned with PANI/CNT/DNNSA stripes was utilized in order to test patterning and adhesion of the dielectric layer onto both the receiver surface and the PANI/CNT/DNNSA conductor surface. The power series of solid block patterns for the dielectric layers of Examples 13 and 17 were printed in a row on top of these stripes.

Thermal Transfer Process for Conductor Stripes:

Pani-3%-#12 and Pani-3%-#14 donors were used in Examples 13 and 17, respectively. A portion of the pani donor and a thermal imaging receiver (~28 cm×18 cm) were loaded into the Creo Trendsetter® 800 thermal platesetter according to the general procedure described above. Seven evenly spaced patterns were printed on the receiver, with each pattern consisting of four horizontal stripes with 13 cm length, 1000 micron width and 1500 micron spacing between the stripes. For Example 13, printing parameters for all patterns were as follows: drum speed=200; surface depth=70; surface reflectivity=0.44; escan=1; 2× hit at 5.25 W. For Example 17, printing parameters for all patterns were as follows: drum speed=170; surface depth=78; surface reflectivity=0.46; escan=1; 2× hit at 5 W.

Thermal Transfer Process for Dielectric Layer:

A portion of the dielectric donor and a thermal imaging receiver (~28 cm×18 cm) were loaded into the Creo Trendsetter® 800 thermal platesetter according to the general procedure described above. (In the case of Examples 13 and 17, the patterned receiver was left in place on the drum after removing the pani donor. The dielectric donor was then loaded.) Solid block patterns were printed using the printing parameters given in Table C. The size of the solid block patterns varied from 2.5 cm×1.25 cm to 2.5 cm×0.8 cm.

TABLE A

PHS and PVA Dielectric Layer Compositions and Electrical Properties

| Ex. | Polymer Amount Wt % | IR Dye Amount Wt % | Plasticizer Amount Wt % | Other Additives Amount Wt % | Solvent Amount | Dielectric Constant (at $10^3$ Hz) Resistivity Ohm-cm |
|---|---|---|---|---|---|---|
| 1 | PHS-B 0.75 g 99.5% | Tic-5c 0.00375 g 0.5% | | | Acetone/Cyclohexanone 3.82/0.42 g | 4.4 $2.5 \times 10^{15}$ |
| 2 | PHS-B 2.25 g 99% | Tic-5c 0.0225 g 1% | | | Acetone/Cyclohexanone 11.45/1.27 g | 3.9 $2.8 \times 10^{15}$ |
| 3 | PHS-B 0.75 g 98% | Tic-5c 0.015 g 2% | | | Acetone/Cyclohexanone 3.81/0.42 g | 3.6 $2.0 \times 10^{15}$ |
| 4[a,b] | CBA 2.848 g 89% | Tic-5c 0.032 g 1% | Glyc Ethox 0.32 g 10% | | Acetone/2-Pentanone 11.52/1.28 g | 3.6 $9.8 \times 10^{14}$ |
| 5[a] | CMM 2.768 g 86.5% | Tic-5c 0.032 g 1% | Glyc Ethox 0.4 g 12.5% | | Acetone/2-Pentanone 11.52/1.28 g | 4.2 $5.2 \times 10^{14}$ |
| 6 | CHM 1.78 g 99% | Tic-5c 0.02 g 1% | | | Acetone/2-MeOEthanol 7.20/0.80 g | 4.3 $1.3 \times 10^{16}$ |
| 7[a,b] | CHM 2.848 g 89% | Tic-5c 0.032 g 1% | Glyc Ethox 0.32 g 10% | | Acetone/2-Pentanone 11.52/1.28 g | 4.8 $1.2 \times 10^{15}$ |
| 8[a,b] | CHM 1.74 g 87% | Tic-5c 0.02 g 1% | Glyc Ethox 0.2 g 10% | Oil Blue N 0.04 g 2% | Acetone/Cyclohexanone 7.20/0.80 g | 5.1 $4.6 \times 10^{14}$ |
| 9 | CHM 1.18 g 59% | Tic-5c 0.02 g 1% | Glyc Ethox 0.2 g 10% | $SrTiO_3$ (Ald) 0.6 g 30% | Acetone/2-MeOEthanol 7.20/0.80 g | 6.8 $2.1 \times 10^{14}$ |
| 10 | CHM 1.18 g 59% | Tic-5c 0.02 g 1% | Glyc Ethox 0.2 g 10% | $SrTiO_3$ (TPL) 0.6 g 30% | Acetone/2-MeOEthanol 7.20/0.80 g | 4.5 $2.1 \times 10^{14}$ |
| 11 | CHM 1.38 g 69% | Tic-5c 0.02 g 1% | | $SrTiO_3$ (Ald) 0.6 g 30% | Acetone/Cyclohexanone 7.20/0.80 g | 5.5 $4.3 \times 10^{14}$ |

TABLE A-continued

PHS and PVA Dielectric Layer Compositions and Electrical Properties

| Ex. | Polymer Amount Wt % | IR Dye Amount Wt % | Plasticizer Amount Wt % | Other Additives Amount Wt % | Solvent Amount | Dielectric Constant (at $10^3$ Hz) Resistivity Ohm-cm |
|---|---|---|---|---|---|---|
| $12^a$ | PVA 3.168 g 99% | Tic-5c 0.032 g 1% | | | Acetone/2-MeOEthanol 10.8/1.28 g | 3.4 $3.8 \times 10^{15}$ |

$^a$Coated on 50% T Cr Blue PET donor substrate.
$^b$Coated on 50% T Ni PET-MB donor substrate. Wt % refers to wt % of the solids in the final dry formulation.

Abbreviations:
PHS-B: Branched PHS homopolymer; DuPont Electronic Technologies;
CBA: PHS copolymer with butyl acrylate, Maruzen;
CMM: PHS copolymer with methyl methacrylate; Maruzen;
CHM: PHS copolymer with hydroxyethyl methacrylate; Maruzen;
PVA: Poly(vinylacetate) from Aldrich (catalog no. 18,949-9) with $M_w$ ~83,000 and $T_g$ ~30° C.;
Glyc Ethox: Glycerol Ethoxylate from Aldrich (catalog no. 441864) with average $M_n$ ~1,000;
Oil Blue N: Aldrich Cat. No. 391557;
Strontium titanate nanoparticles: ~50 nm from Aldrich and TPL as indicated;
2-MeOEthanol: 2-MethoxyEthanol.

TABLE B

Novolac ® Dielectric Layer Compositions and Electrical Properties

| Ex. | Polymer Amount Wt % | IR Dye Amount Wt % | Other Additives Amount Wt % | Solvent Amount | Dielectric Constant (at $10^3$ Hz) Resistivity Ohm-cm |
|---|---|---|---|---|---|
| $13^a$ | HRJ14198 5.91 g 97.9% | Tic-5c 0.09 g 1.5% | Zonyl FSO 0.03 g 0.6% | 2-Butanone 24.00 g | 3.9 $3.0 \times 10^{15}$ |
| $14^a$ | HRJ14198 1.98 g 99% | Tic-5c 0.02 g 1% | | 2-Butanone 8.00 g | 3.9 $2.1 \times 10^{15}$ |
| $15^a$ | HRJ14198 1.98 g 99% | Tic-5c 0.02 g 1% | | Acetone/2-MeOEthanol 7.20/0.80 g | 4.0 $8.8 \times 10^{15}$ |
| $16^a$ | HRJ14198 1.38 g 69% | Tic-5c 0.02 g 1% | $SrTiO_3$ (Ald) 0.6 g 30% | 2-Butanone 8.00 g | 5.2 $1.2 \times 10^{14}$ |
| $17^a$ | HRJ14198 1.38 g 69% | Tic-5c 0.02 g 1% | $SrTiO_3$ (TPL) 0.6 g 30% | Acetone/2-MeOEthanol 7.20/0.80 g | 6.7 $1.1 \times 10^{16}$ |
| $18^a$ | HRJ1583 1.98 g 99% | Tic-5c 0.02 g 1% | | 2-Butanone 8.00 g | 3.6 $2.7 \times 10^{14}$ |
| $19^a$ | HRJ1583 0.78 g 39% | Tic-5c 0.02 g 1% | $SrTiO_3$ (TPL) 1.2 g 60% | 2-Butanone 8.00 g | 13.7 $4.8 \times 10^{18}$ |

$^a$Coated on 50% T Cr Blue PET donor substrate.
Wt % refers to wt % of the solids in the final dry formulation.

Abbreviations:
HRJ14198 and HRJ1583 are Novolac ® resins purchased from Schenectady International Inc.;
2-MeOEthanol: 2-MethoxyEthanol.
Strontium titanate nanoparticles: ~50 nm from Aldrich and TPL as indicated.

TABLE C

Donor Elements and Printing Parameters of Dielectric Layer Compositions of Tables A & B

| Ex. | Donor | Receiver | $DS^a$ | $SD^b$ | $SR^c$ | Power (W) | Step (W) | Optimal Transfer$^d$ (W) |
|---|---|---|---|---|---|---|---|---|
| $4^e$ | 50% T Ni PET-MB | R-2 | 100 | 70 | 0.60 | 3.0-8.0 | 0.50 | 5.0 |
| $7^e$ | 50% T Ni PET-MB | R-2 | 100 | 70 | 0.60 | 3.0-8.0 | 0.50 | 5.0 |
| $12^f$ | 50% T Cr Blue PET | R-1 | 100 | 105 | 0.28 | 3.0-8.0 | 0.50 | 5.0 |
| 13 | 50% T Cr Blue PET | R-1/Pani | 200 | 105 | 0.31 | 3.0-8.0 | 0.50 | 6.0 |
| 17 | 50% T Cr Blue PET | R-1 | 170 | 105 | 0.33 | 3.0-12.5 | 0.50 | 8.5 |
| $19^g$ | 50% T Cr Blue PET | R-1/Pani | 170 | 105 | 0.32 | 6.5-11.5 | 0.50 | 8.5-10.5$^h$ |

$^a$DS: drum speed.
$^b$SD: surface depth.
$^c$SR: surface reflectivity.
$^d$Optimal transfer refers to largely complete transfer of the dielectric with minimal defects.
$^{e-g}$In the donor element fabrication, the compositions are the same as reported in Tables A and B with the exception of some solvent variation:
$^e$2-Pentanone was replaced by cyclohexanone.
$^f$2-Methoxyethanol was replaced by 2-butoxyethanol.
$^g$2-Butanone was replaced by a 9:1 mixture of acetone/2-pentanone.
$^h$8.5 W: complete onto receiver; 10.5 W: complete onto conductor layer and receiver.

EXAMPLES 20-23 AND COMPARATIVE EXAMPLE C-1

Commercial Styrene-Acrylic Polymers as Dielectric Layers

Dielectric layers comprising commercial styrene-acrylic polymers were prepared from the components reported in Table D according to the general procedure given above for the preparation of aqueous-based dielectrics. The electrical properties of these dielectrics were determined through resistivity measurements and through characterization of electrical performance in printed TFT's and capacitors.

Joncryl 95 (J-95) acrylic latex is from Johnson Polymer with Tg of 43° C., an acid number of 70, and a Z-average particle size of 40.5 nm. Joncryl 1915 (J-1915) acrylic latex is from Johnson Polymer with a Tg of 43° C., an acid number of 66, and a Z-average particle size of 75.6 nm. Joncryl 63 (J-63) styrene acrylic resin is from Johnson Polymer with a Tg of 73° C., an acid number of 213, and a Mw of 12,000.

In a printed TFT array, a Joncryl 1915 (Examples 22 and 60) dielectric gave a high yield of working transistors (>96%) with low off current [median $Log(I_{off})$=−11.5]. Joncryl 95 alone (Examples 21 and 61) and in combination with Joncryl 63 (Examples 23 and 63) in dielectrics gave transistors with a median mobility of 0.05 $cm^2V^{-1}s^{-1}$ and median $Log\ (I_{off})$ of −10 or less. Joncryl 63 as the sole dielectric polymer gave a resistivity less than $10^{14}$ ohm-cm (Comparative Example 1).

TABLE D

Dielectric Layer Compositions and Electrical Properties Utilizing Commercial Styrene-Acrylic Polymers

| Ex. | Polymer Amount Wt % | Polymer Amount Wt % | IR Dye Amount Wt % | Surfactant Amount Wt % | Other Additives Wt % | Solvent Amount | pH OD | Dielectric Constant (at $10^3$ Hz) Resistivity Ohm-cm |
|---|---|---|---|---|---|---|---|---|
| 20 | J-95 12.600 g 95.9% | | SDA 4927 0.060 g 1.5% | Byk 345 0.104 g 2.6% | | $H_2O$ 9.201 g | 8.16 0.40 | 3.2 $3.6 \times 10^{15}$ |
| 21 | J-95 16.780 g 93.6% | | SDA 2860 0.290 g 5.4% | Byk 348 0.055 g 1.0% | | $H_2O$ 12.840 g | 7.99 0.98 | $^a$Ex. 61 |
| 22 | J-1915 11.430 g 93.6% | | SDA 2860 0.290 g 5.4% | Byk 348 0.055 g 1.0% | | $H_2O$ 18.170 g | 8.67 | $^a$Ex. 60 |
| 23 | J-95 8.390 g 48.5% | J-63 8.370 g 48.5% | SDA 2860 0.105 g 2.0% | Byk 348 0.050 g 1.0% | | $H_2O$ 11.980 g | 8.22 0.70 | $^a$Ex. 62 |
| C-1$^b$ | J-63 12.600 g | | SDA 2860 0.081 g 2.0% | Zonyl FSN 0.100 g 1.0% | Glyc Ethox 0.100 g 2.5% | $H_2O$/2BuO-Ethanol 8.89/0.941 g | 8.60 0.75 | $5.9 \times 10^{13}$ |

$^a$Electrical performance was characterized by the electrical performance of printed TFT's utilizing this dielectric as reported in the indicated Examples.
$^b$Resistivity was determined by the ITO Method, as described above. Wt % refers to wt % of the solids in the final dry formulation.
Abbreviations:
OD: Optical density of ~2.3 micron film;
Glyc Ethox: Glycerol Ethoxylate;
2BuOEthanol: 2-ButoxyEthanol.

EXAMPLES 24-34

Dielectric Layers with SDA 2860, Acrylic Latex and Various Surfactants

Dielectric layers comprising various amounts of SDA 2860, mixtures of varied Tg acrylic latex with 0-3% acid, and various surfactants were prepared from the components reported in Table E according to the general procedure given above for the preparation of aqueous-based dielectrics.

TABLE E

Acrylic Dielectric Layer Compositions and Electrical Properties

| Ex. | Polymer Amount Wt % | Polymer Amount Wt % | IR Dye Amount Wt % | Surfactant Amount Wt % | Solvent Amount | pH OD | Dielectric Constant (at $10^3$ Hz) Resistivity Ohm-cm |
|---|---|---|---|---|---|---|---|
| 24 | LH-3 12.78 g 78.6% | LL-3 2.44 g 15.0% | SDA 2860 0.290 g 5.4% | Byk 345 0.055 g 1.0% | $H_2O$/2BuO-Ethanol 12.95/1.39 g | 4.44 | 3.3 $3.2 \times 10^{15}$ |
| 25 | LH-3 12.780 g 78.6% | LL-3 2.440 g 15.0% | SDA 2860 0.290 g 5.4% | Zonyl FSN 0.130 g 1.0% | $H_2O$/2BuO-Ethanol 12.95/1.30 g | 4.81 | 3.2 $2.5 \times 10^{15}$ |
| 26 | LH-3 12.780 g 78.6% | LL-3 2.440 g 15.0% | SDA 2860 0.290 g 5.4% | TG Surf. 0.065 g 1.0% | $H_2O$/2BuO-Ethanol 12.95/1.38 g | 4.60 | 3.3 $1.9 \times 10^{15}$ |

TABLE E-continued

Acrylic Dielectric Layer Compositions and Electrical Properties

| Ex. | Polymer Amount Wt % | Polymer Amount Wt % | IR Dye Amount Wt % | Surfactant Amount Wt % | Solvent Amount | pH OD | Dielectric Constant (at $10^3$ Hz) Resistivity Ohm-cm |
|---|---|---|---|---|---|---|---|
| 27 | LH-3 12.780 g 79.4% | LL-3 2.440 g 15.2% | SDA 2860 0.290 g 5.5% | | $H_2O$/2BuO-Ethanol 12.70/1.39 g | 4.27 | 3.1 $3.4 \times 10^{15}$ |
| 28 | LH-3 12.78 g 77.6% | LL-3 2.44 g 14.8% | SDA 2860 0.290 g 5.3% | Zonyl FSA 0.220 g 1.0% | $H_2O$/2BuO-Ethanol 13.08/1.39 g | 6.26 0.8 | 3.2 $1.2 \times 10^{14}$ |
| 29 | LH-3 11.120 g 68.3% | LL-3 4.120 g 25.3% | SDA 2860 0.290 g 5.4% | Byk 345 0.055 g 1.0% | $H_2O$/2BuO-Ethanol 12.96/1.38 g | 4.93 0.81 | 3.2 $1.9 \times 10^{15}$ |
| 30 | LH-3 13.59 g 83.6% | LL-3 1.63 g 10.0% | SDA 2860 0.290 g 5.4% | Byk 345 0.055 g 1.0% | $H_2O$/2BuO-Ethanol 12.95/1.39 g | 4.58 | 3.2 $4.3 \times 10^{15}$ |
| 31 | LH-3 14.40 g 88.5% | LL-3 0.820 g 5.0% | SDA 2860 0.290 g 5.4% | Byk 345 0.055 g 1.0% | $H_2O$/2BuO-Ethanol 12.95/1.39 g | 4.59 | 3.3 $3.5 \times 10^{15}$ |
| 32 | LH-1 10.310 g 63.3% | LL-1 4.930 g 30.3% | SDA 2860 0.290 g 5.4% | Byk 345 0.055 g 1.0% | $H_2O$/2BuO-Ethanol 12.96/1.39 g | 4.48 | $^a$Ex. 64, 65, & 67 |
| 33 | LH-0 11.120 g 68.3% | LL-0 4.120 g 25.3% | SDA 2860 0.290 g 5.4% | Byk 345 0.055 g 1.0% | $H_2O$/2BuO-Ethanol 12.96/1.38 g | 7.35 | $^a$Ex. 58 |
| 34 | LH-1 10.310 g 63.3% | LL-1 4.930 g 30.3% | SDA 2860 0.290 g 5.4% | Byk 348 0.055 g 1.0% | $H_2O$ 14.35 g | 4.60 0.95 | $^a$Ex. 59 |

$^a$Electrical performance was characterized by the electrical performance of printed TFT's utilizing this dielectric as reported in the indicated Examples.
Wt % refers to wt % of the solids in the final dry formulation.
Abbreviations:
OD: Optical density of ~2.3 micron film;
2BuOEthanol: 2-ButoxyEthanol;
TG Surf.: TG Surfactact (Air Products).

EXAMPLES 35-42

Dielectric Layers with SDA 4927, Acrylic Latex, and Various Surfactants, Additives and Cosolvents Dielectric layers comprising various amounts of SDA 4927, varied Tg acrylic latex with 1-3% acid, surfactants, co-solvents and triethanolamine ethoxylate (TEOE) were prepared from the components reported in Table F according to the general procedure given above for the preparation of aqueous-based dielectrics.

TABLE F

Acrylic Dielectric Layer Compositions and Electrical Properties

| Ex. | Polymer Amount Wt % | Polymer Amount Wt % | IR Dye Amount Wt % | Surfactant Amount Wt % | Other Additives Wt % | Solvent Amount | pH OD | Dielectric Constant (at $10^3$ Hz) Resistivity Ohm-cm |
|---|---|---|---|---|---|---|---|---|
| 35 | LH-3 12.78 g 80.4% | LL-3 2.44 g 15.4% | SDA 4927 0.130 g 2.5% | Zonyl FSA 0.200 g 1.0% | TEOE 0.043 g 0.8% | $H_2O$/2BuO-Ethanol 12.04/1.35 g | 5.94 0.41 | 3.2 $3.3 \times 10^{15}$ |
| 36 | LH-3 12.78 g 77.8% | LL-3 2.44 g 14.9% | SDA 4927 0.260 g 4.8% | Zonyl FSA 0.200 g 0.9% | TEOE 0.086 g 1.6% | $H_2O$/2BuO-Ethanol 12.64/1.30 g | 5.40 0.80 | 3.3 $7.6 \times 10^{14}$ |
| 37 | LH-3 11.11 g 70.8% | LL-3 4.11 g 26.2% | SDA 4927 0.080 g 1.5% | Byk 346 0.100 g 1.0% | TEOE 0.023 g 0.4% | $H_2O$/2BuO-Ethanol 12.07/1.35 g | 3.17 0.29 | 3.1 $6.2 \times 10^{15}$ |
| 38 | LH-3 11.11 g 69.9% | LL-3 4.11 g 25.8% | SDA 4927 0.130 g 2.5% | Byk 346 0.100 g 1.0% | TEOE 0.043 g 0.8% | $H_2O$/2BuO-Ethanol 12.40/1.35 g | 3.35 | 3.1 $1.7 \times 10^{15}$ |
| 39 | LH-3 11.11 g 69.9% | LL-3 4.11 g 25.8% | SDA 4927 0.130 g 2.5% | Byk 346 0.100 g 1.0% | TEOE 0.043 g 0.8% | $H_2O$/iPrOH 12.40/1.35 g | 3.49 0.51 | 3.1 $2.6 \times 10^{15}$ |
| 40 | LH-3 11.11 g 68.9% | LL-3 4.11 g 25.5% | SDA 4927 0.185 g 3.5% | Byk 346 0.100 g 1.0% | TEOE 0.061 g 1.1% | $H_2O$/2BuO-Ethanol 12.73/1.35 g | 3.36 0.73 | 3.4 $1.9 \times 10^{15}$ |

TABLE F-continued

Acrylic Dielectric Layer Compositions and Electrical Properties

| Ex. | Polymer Amount Wt % | Polymer Amount Wt % | IR Dye Amount Wt % | Surfactant Amount Wt % | Other Additives Wt % | Solvent Amount | pH OD | Dielectric Constant (at $10^3$ Hz) Resistivity Ohm-cm |
|---|---|---|---|---|---|---|---|---|
| 41 | LH-3 11.11 g 67.5% | LL-3 4.11 g 25.0% | SDA 4927 0.265 g 4.9% | Byk 346 0.100 g 1.0% | TEOE 0.088 g 1.6% | H$_2$O/2BuO-Ethanol 13.22/1.35 g | 3.29 1.03 | 3.2 $1.2 \times 10^{15}$ |
| 42 | LH-3 16.068 g 98.2% | | SDA 4927 0.040 g 0.7% | Zonyl FSA 0.224 g 1.0% | | H$_2$O/2BuO-Ethanol 11.48/1.99 g | 5.25 | 2.8 $2.4 \times 10^{14}$ |

Wt % refers to wt % of the solds in the final dry formulation.
Abbreviations:
OD: Optical density of ~2.3 micron film;
2BuOEthanol: 2-ButoxyEthanol;
TEOE: Triethanolamine ethoxylate from Aldrich (cat. no. 416584).

EXAMPLE 43 AND COMPARATIVE EXAMPLES C-2 AND C-3

Barium Titanate Acrylic Dielectric Layers

Dielectric layers comprising acrylic latex and solution-based polymers were prepared from the components reported in Example 43 of Table G according to the general procedure given above for the preparation of aqueous-based dielectrics.

Examples C-2 and C-3 are comparative examples prepared according to the procedure of Example 1 of WO2005/004205. The relatively high acid number, solution-based acrylic dispersant (Acid No.=106) was utilized as the sole dielectric polymer and gave low resistivities ($10^{12}$ ohm-cm) when combined with barium titanate nanoparticles. When the same dispersant and barium titanate nanoparticles were combined with a low acid number latex, a high resisitivity dielectric was obtained as illustrated in Example 43.

Preparation of BaTiO$_3$ dispersions for Examples 43, C-2 and C-3: The BaTiO$_3$ pigment dispersion was prepared according to the method of WO 2005/004205 as follows: Materials included Cabot BaTiO$_3$ nanoparticles (Cabot Corporation, Boston, Mass.) and DR-3 (a graft copolymer with an acrylate backbone, 69%, and methacrylate arms, 31%). The specific structure of the backbone is n-butyl acrylate/methyl acrylate/acrylic acid (45.5/45.5/9), and that of the arms is methyl methacrylate/methacrylic acid (71.25/28.75), and is described in WO9421701A1; $M_w$=24,000; $M_n$=9500; Arm $M_n$~1500-2000. The pigment dispersion was prepared at 25% solids loading, with a pigment-to-dispersant ratio (P/D) of 2.0, as described in U.S. Pat. No. 5,231,131. A mixture of 236.16 g of water, 48.56 g of dispersant solution, and 6.92 g of 2-amino-2-methyl-1-propanol was charged, along with 58.36 g of BaTiO$_3$, to an attritor (Appol® Trick Titanium, Troy, Mich.). The attritor contained 850 g of 0.8-1.0 micron zirconia media. The mixture was processed for 12 h, keeping the temperature below 38° C. Filtration through a one-micron filter produced the pigment dispersion. Dispersions of P/D-1.5 and P/D-8 were prepared in the same manner.

TABLE G

Acrylic Dielectric Layer Compositions and Electrical Properties

| Ex. | Polymer Amount Wt % | IR Dye Amount Wt % | Surfactant Amount Wt % | Other Additives Amount Wt % | Solvent Amount | Dielectric Constant $10^3$ Hz Resistivity[a] Ohm-cm |
|---|---|---|---|---|---|---|
| 43 | LH-3-2GA 2.25 g 49.1% | SDA 4927 0.026 g 1.7% | Zonyl FSA 0.005 g 0.1% | BaTiO$_3$ & DR3 P/D-8 2.97 g 49.1% | H$_2$O/2BuO-Ethanol 4.25/0.50 g 15.12% | 5.3 $2.4 \times 10^{14}$ |
| C-2 | BaTiO$_3$ &DR3 P/D-1.5 1 g 100% | | | | | 8.6 $7 \times 10^{12}$ |
| C-3 | BaTiO$_3$ &DR3 P/D-8 1 g 100% | | | | | 21.3 $1 \times 10^{12}$ |

[a]Electrical measurements were obtained by spin-coating the dielectric utilizing the method give above.
Wt % refers to wt % of the solids in the final dry formulation.

EXAMPLES 44-52

Hydroxyethyl methacrylate-Containinq Dielectrics; Donors with Multilayer Dielectrics, Gradient Dielectric Layers, and Interlayers

EXAMPLE 44

This example illustrates a donor with Topas® copolymer interlayer. Formulations H-1 and H-2 were prepared according to the above general procedure for solvent-based dielectrics. T-5013 is Topas® 5013 (Ticona) ethylene-norbornene copolymer with a heat deflection temperature of 130° C., and J-611 is Joncryl 611 styrene acrylic resin (Johnson Polymer), with a Mw of 8100, Acid No.=53, and Tg=50° C. The Topas® copolymer interlayer formulation H-1 (3 mL) was coated on a 50% T Cr Blue donor substrate using a 2CN coating rod and a coating speed of 9.8 ft/min. The film was dried for 6 min. at 45° C. The J-611 transfer layer formulation H-2 (7 mL) was coated on top of the T-5013 interlayer using a 7CN coating rod and a coating speed of 9.8 ft/min. The film was dried for 6 min at 45° C. The ability to thermal-transfer this dielectric onto a conductor and receiver surface was demonstrated following the procedures for printing dielectric blocks over conductor stripes given under Examples 1-19. The conductor utilized was Ag/Elv-CN8 and was printed in the stripe pattern at ds 160 at 7.6 W. The dielectric was printed at ds 180 at 8.25 to 10.75 W in 0.25 W step increments. Transfer of the dielectric was largely complete onto both the receiver and silver surfaces at 8.75 W.

EXAMPLE 45

This example illustrates a tri-layer dielectric donor with gradient dye layers. Using a CV coater, formulation H-3 (3 mL) was coated onto a 40% T Cr Blue donor substrate with a CN-3 rod at 9.8 ft/min and then dried for 6 min. at 45° C. This procedure was repeated for formulations H-4 and H-5, coating H-4 on top of H-3 and H-5 on top of H-4 to give a trilayer dielectric with gradient dye layers. Thermal transfer as in example 66 yielded a TFT with the dielectric layer with the lowest dye loading adjacent to the semiconductor.

EXAMPLE 46

This example illustrates a bi-layer dielectric donor with gradient dye layers. Formulation H-6 (4 mL) was coated, using a CV coater, onto a 40% T Cr Blue donor substrate with a CN-4 rod at 9.8 ft/min and then dried for 6 min. at 45° C. This procedure was repeated for formulation H-5, coating H-5 on top of H-6 to give a bi-layer dielectric with gradient dye layers. Thermal transfer yielded a bottom-gate TFT with the dielectric surface with the lowest dye loading adjacent to the semiconductor. Conductor donors and printing conditions were analogous to Example 66 with the exception that the dielectric layer was printed at 9.75 W.

EXAMPLE 47

This example illustrates a tri-layer dielectric donor with gradient dye layers and a Layer B. Using a CV coater, formulation H-7 (3 mL) is coated onto a 40% T Cr Blue donor substrate with a CN-3 rod at 9.8 ft/min and then dried for 6 min. at 45° C. This procedure is repeated for formulations H-4 and H-5, coating H-4 on top of H-7 and H-5 on top of H-4 to give a trilayer dielectric with gradient dye layers. Thermal transfer as in Example 66 yields a bottom-gate TFT with the acid- and dye-free dielectric surface (Layer B) adjacent to the semiconductor.

EXAMPLE 48

This example illustrates a bi-layer dielectric donor with a carbon black-containing layer. Using a CV coater, formulation H-8 (3 mL) was coated onto an Organic LTHC Blue donor substrate with a CN-3 rod at 7.1 ft/min and then dried for 6 min. at 45° C. Formulation H-9 (4 mL) was then coated on top of H-8 with a CV coater at 7.1 ft/min using a CN-4 rod to give a bi-layer dielectric. Thermal transfer as in Example 66 yields a bottom-gate TFT with the smooth carbon-black-free dielectric surface adjacent to the semiconductor.

EXAMPLE 49

This example illustrates a bi-layer dielectric donor with a strontium titanate-containing layer. Using a CV coater, formulation H-8 (3 mL) was coated onto an Organic LTHC Blue donor substrate with a CN-2 rod at 7.1 ft/min and then dried for 6 min. at 45° C. Formulation H-10 (5 mL) was then coated on top of H-8 with a CV coater at 9.8 ft/min using a CN-5 rod to give a bilayer dielectric. Thermal transfer as in Example 66 yields a bottom-gate TFT with the smooth, nanoparticle-free dielectric surface adjacent to the semiconductor.

EXAMPLE 50

This example illustrates bi-layer dielectric donor with gradient nanoparticle layers. Using a CV coater, formulation H-10 (3 mL) is coated onto an Organic LTHC Blue donor substrate with a CN-2 rod at 7.1 ft/min and then dried for 6 min. at 45° C. Formulation H-11 (5 mL) is then coated on top of H-10 with a CV coater at 9.8 ft/min using a CN-5 rod to give a bilayer dielectric. Thermal transfer as in Examples 66 yields a bottom-gate TFT with the smooth dielectric surface with the lower nanoparticle loading adjacent to the semiconductor.

EXAMPLE 51

This example illustrates bi-layer dielectric donor with nanoparticle layer and Layer B. Using a CV coater, formulation H-7 (3 mL) is coated onto a 40% T Or Blue donor substrate with a CN-2 rod at 7.1 ft/min and then dried for 6 min. at 45° C. Formulation H-11 (5 mL) is then coated on top of H-7 with a CV coater at 9.8 ft/min using a CN-5 rod to give a bilayer dielectric. Thermal transfer as in Examples 66 yields a TFT with the acid- and dye-free dielectric surface adjacent to the semiconductor.

EXAMPLE 52

This example illustrates a jydroxyethylmethacrylate-containing dielectric. Using a CV coater, formulation H-12 (7 mL) was coated onto a 40% T Cr Blue donor substrate with a CN-7 rod at 9.8 ft/min and then dried for 6 min. at 45° C.

TABLE H

Formulations for Interlayers and Multilayer Dielectrics

| No. | Polymer Amount Wt % | Polymer Amount Wt % | IR Dye Amount Wt % | Surfactant Amount Wt % | Other Additives Wt % | Solvent Amount | pH OD |
|---|---|---|---|---|---|---|---|
| H-1[a] | T-5013 5.000 g 100% | | | | | Cyclohexane 95.00 g | |
| H-2[a] | J-611 3.790 g 97.7% | | Tic-5c 0.040 g 1.0% | Zonyl FSO-100 0.050 g 1.3% | | Acetone 17.73 g | |
| H-3[b] | LH-1 11.110 g 70.2% | LL-1 4.110 g 26.0% | SDA 4927 0.080 g 1.5% | Byk 348 0.100 g 1.9% | TEOE 0.023 g 0.40% | $H_2O$ 13.83 g | 3.93 |
| H-4[b] | LH-1 11.110 g 68.9% | LL-1 4.110 g 25.5% | SDA 4927 0.185 g 3.5% | Byk 348 0.055 g 1.0% | TEOE 0.061 g 1.1% | $H_2O$ 14.55 g | 3.68 |
| H-5[b] | LH-1 22.220 g 67.5% | LL-1 8.220 g 25.0% | SDA 4927 0.530 g 4.9% | Byk 348 0.110 g 1.0% | TEOE 0.176 g 1.6% | $H_2O$ 30.100 g | 3.52 |
| H-6[b] | LH-1 11.110 g 70.8% | LL-1 4.110 g 26.2% | SDA 4927 0.080 g 1.5% | Byk 348 0.055 g 1.1% | TEOE 0.023 g 0.40% | $H_2O$ 13.89 g | 3.30 |
| H-7[c] | LH-0 11.110 g 72.2% | LL-0 4.110 g 26.7% | | Byk 348 0.055 g 1.1% | | $H_2O$ 13.02 g | |
| H-8[b] | LH-1 10.310 65.9% | LL-1 4.930 31.5 | SDA 2860 0.080 g 1.6% | Byk 348 0.050 g 1.0% | | $H_2O$ 13.38 | 3.50 |
| H-9[b] | LH-1 10.310 62.3% | LL-1 4.930 29.8% | SDA 2860 0.085 g 1.6% | Byk 348 0.050 g 0.9% | Black 32B56[d] 0.910 g 5.5 wt % | $H_2O$ 13.38 | 7.00 |
| H-10[b] | LH-1 10.310 g 51.2% | LL-1 4.930 24.5% | SDA 2860 0.085 g 1.3% | Byk 348 0.050 g 0.8% | $SrTiO_3$ (TPL)[e] 1.400 g 21.1% | $H_2O$ 20.17 | 8.74 |
| H-11[b] | | LL-1 1.250 9.7% | SDA 2860 0.043 g 1.0% | Byk 348 0.043 g 1.0% | $SrTiO_3$ (TPL)[f] 3.549 g 83.4% | $H_2O$ 18.614 | |
| H-12[b] | LHEA-6 15.240 g 91.9% | | SDA 2860 0.290 g 5.3 wt % | Byk 345 0.055 g 1.0% | PEG-$OMe_2$[g] 0.100 g (1.8 wt %) | $H_2O$/2BuO-Ethanol 13.42/1.39 g | 4.14 0.88 |

Wt % refers to wt % of the solids in the final dry formulation.
Prepared according to the above general procedures for
[a]solvent-based and
[b]aqueous dielectric formulations.
[c]Prepare according to the above general procedures for aqueous dielectric formulations.
[d]Carbon Black Acroverse Paste 32B56 (33 wt %; Penn Color).
[e]Formulation also contained 0.007 g (0.1 wt %) of Surfynol DF110D (Air Products) and 0.074 g of Disperbyk 190 (Byk Chemie). The Surfynol, Disperbyk, $SrTiO_3$ nanoparticles and .1.850 g of the water were probe-sonicated in a vial placed in an ice bath for 3 × 10 min with 5 min intervals between sonication cycles and then rolled at least one day with 0.5 mm zirconia media prior to adding to the formulation.
[f]Formulation also contained 0.019 g (0.4 wt %) of Surfynol DF110D and 0.188 g (4.4 wt %) of Disperbyk 191 (Byk Chemie). The Surfynol, Disperbyk, $SrTiO_3$ nanoparticles and 4.694 g of the water were probe-sonicated in a vial placed in an ice bath for 3 × 10 min with 5 min intervals between sonication cycles and then rolled at least one day with 0.5 mm zirconia media prior to adding to the formulation.
[g]Abbreviations: OD: Optical density of ~2.3 micron film; 2BuOEthanol: 2-ButoxyEthanol; TEOE: Triethanolamine ethoxylate from Aldrich (cat. no. 416584); PEG-$OMe_2$ polyethyleneglycol dimethylether (Aldrich 44,590-8); Strontium titanate nanoparticles: ~50 nm from TPL.

EXAMPLES 53-67 AND COMPARATIVE EXAMPLE -4C

Composition, Printing Parameters and Characterization of TFT's and TFT Arrays

The TFT's and TFT arrays reported in Examples 53-67 and C-4 were prepared according to the procedures disclosed in the sections entitled "General procedures for printing bottom-gate transistors with associated capacitors, bus lines and test pads" and the "General procedure for semiconductor evaporation." Details regarding donors and receivers, printing conditions, and TFT performance are given in Table I 1-3 and Table J 1-3. Comparative Example C-4, where the dielectric is laminated, demonstrates that dielectrics that have significant quantities of IR absorbers and that have been processed through thermal transfer can be used to produce TFT's with comparable and, at times, better performance and yield than TFT's produced with a similar dielectric without the IR absorber and processed through a milder lamination process.

TABLE I-1

Donors for TFT's

| Ex | Gate Donor | Dielectric Donor | Source-Drain Donor | Semi-conductor |
|---|---|---|---|---|
| 53 | Pani-7% Additional air | Ex. 29 Organic LTHC Green PET | Pani-7% 40 min | Evaporated Pentacene |

TABLE I-1-continued

Donors for TFT's

| Ex | Gate Donor | Dielectric Donor | Source-Drain Donor | Semi-conductor |
|---|---|---|---|---|
| | | dry for days donor substrate; 30 min additional dry at 45° C. | additional dry at 45° C. | |
| 54 | mPani-7%-b | Ex. 29 40% T Cr Blue PET donor substrate; 30 min additional dry at 45° C. | Pani-7% | Evaporated Pentacene |
| 55 | Pani-7% | Ex. 41 w/o TEOE 40% T Cr Blue PET; 40 min additional dry at 45° C. | Pani-7% | Evaporated Pentacene |
| 56 | Pani-7% | Ex. 41 w/o TEOE 40% T Cr Blue PET donor substrate; 40 min additional dry at 45° C. | Pani-7% | Evaporated SC-H1 |
| 57 | Pani-7% Additional air dry for days | Ex. 41 w/Byk 345 40% T Cr Blue PET donor substrate; 40 min additional dry at 45° C. | Pani-7% 40 min additional dry at 45° C. | Evaporated Pentacene |

Receiver: 5 mil Kapton HN (DuPont).

TABLE I-2

Printing Patterns and Parameters for TFT's

| | TFT | Dielectric | Printing Parameters | | |
|---|---|---|---|---|---|
| Ex | Pattern | Pattern | Gate | Dielectric | Source-Drain |
| 53 | 1 | Solid | DS = 205 at 5.70 W | DS = 205 at 8.35 W | DS = 205 at 5.75 W |
| 54 | 1 | Solid | DS = 205 at 5.25 W | DS = 120 at 5.75 W | DS = 205 at 5.35 W |
| 55 | 1 | Solid | DS = 205 at 5.7 W | DS = 160 at 7.3 W | DS = 205 at 5.75 W |
| 56 | 1 | Solid | DS = 205 at 5.7 W | DS = 200 at 8.5 W | DS = 205 at 5.75 W |
| 57 | 1 | Solid | DS = 205 at 5.7 W | DS = 160 at 7.5 W | DS = 205 at 5.75 W |

TABLE I-3

Electrical Performance of TFT's

| Ex | Mobility ($cm^2V^{-1}s^{-1}$) | $V_{Th}$ (V) | $I_{on}$ (A) | $I_{off}$ (A) | $I_{on}/I_{off}$ |
|---|---|---|---|---|---|
| 53 | 0.120 | −5.60 | 1.70E−06 | 9.7E−12 | 1.80E+05 |
| 54 | 0.060 | −6.00 | 8.00E−07 | 8.00E−13 | 1.00E+06 |
| 55 | 0.180 | 4.70 | 3.60E−06 | 2.10E−11 | 1.70E+05 |
| 56 | 0.536 | −8.20 | 6.59E−06 | 3.16E−11 | 2.10E+05 |
| 57 | 0.120 | −1.80 | 2.10E−06 | 1.00E−11 | 2.00E+05 |

TABLE J-1

Donors for Printed TFT Arrays

| Ex | Gate Donor | Dielectric Donor | Source-Drain Donor | Semiconductor |
|---|---|---|---|---|
| 58 | Ag/Elv-#8 40 min additional dry at 45° C. | Ex. 33 40% T Cr Blue PET donor substrate; 40 min additional dry at 45° C. | Pani-7% 40 min additional dry at 45° C. followed by air dry for 3 days | Evaporated Pentacene |
| 59 | Pani-7% Additional air dry for days | Ex. 34 WPTS ® 3737[a] | Pani-7% 40 min additional dry at 50° C. | Evaporated Pentacene |
| 60 | Ag/Elv-CN7 40 min additional dry at 50° C. | Ex. 22 40% T Cr Blue PET donor substrate; 40 min additional dry at 45° C. | Pani-7% 40 min additional dry at 50° C. | Evaporated Pentacene |
| 61 | mPani-7%-b | Ex. 21 40% T Cr Blue PET donor substrate; 40 min additional dry at 45° C. | Pani-7%[c] | Evaporated Pentacene |
| 62 | Pani-7% 10 min additional dry at 50° C. | Ex. 23 40% T Cr Blue PET donor substrate; 40 min additional dry at 45° C. | Pani-7% 40 min additional dry at 45° C. | Evaporated Pentacene |
| 63 | Pani-7%[d] | Ex. 29 50% T Cr Blue PET donor substrate; 40 min additional dry at 50° C. | Ag/ElvCNT-#8 60 min additionaldry at 50° C. | Evaporated Pentacene |
| 64 | mAg/Elv-CN8 40 min | Ex. 32 50% T Cr Blue PET | Pani-7%[c] 40 min additional dry | Evaporated SC-H1 |

TABLE J-1-continued

Donors for Printed TFT Arrays

| Ex | Gate Donor | Dielectric Donor | Source-Drain Donor | Semiconductor |
|---|---|---|---|---|
| | additional dry at 45° C. | donor substrate; 40 min additional dry at 45° C. | at 50° C. | |
| 65 | mAg/Elv-CN8 40 min additional dry at 45° C. | Ex. 32 50% T Cr Blue PET donor substrate; 40 min additional dry at 45° C. | Pani-7%[c] 40 min additional dry at 50° C. | Evaporated SC-H2 |
| 66 | Ag/Elv-CN8 40 min additional dry at 50° C. | Ex. 45 40% T Cr Blue PET donor substrate; 40 min additional dry at 45° C. | Pani-7% 40 min additional dry at 50° C. | Evaporated Pentacene |
| 67 | Ag/Elv-CN7 60 min additional dry at 50° C. | Ex. 32 40% T Cr Blue PET donor substrate; 40 min additional dry at 45° C. | Pani-7% 40 min additional dry at 45° C. | Evaporated Pentacene |
| C-4 | Ag/Elv-CN7 40 min additional dry at 50° C. | LH-10-2GA Laminated from R-3 Receiver[b] | Pani-7% 90 min additional dry at 45° C. | Evaporated Pentacene |

Receiver: 5 mil Kapton HN.
[a]WPTS ® 3737: (WaterProof ® Transfer Sheet) (DuPont; Towanda, PA).
[b]Dye-free dielectric of composition LH-10-2GA was laminated from R-3.
[c]Following source-drain printing and before evaporation of pentacene, peel defects between the source and drain electrodes were selectively removed from the receiver together with peel defects along line edges according to the following procedure: A piece of 50% T Cr PET donor substrate was cut to approximately the same size as the receiver and cleaned with a pressurized nitrogen stream to rid the surface of particle contamination. The receiver was placed on a flat surface, and the Cr-coated substrate was placed on top of the receiver with the Cr surface contacting the patterned surface of the receiver. A SDI Dust Removal System-1 roller was rolled over the entire area of the backside of the Cr-coated substrate in a period of approximately 30-90 seconds. The Cr-coated substrate was lifted off of the patterned receiver surface. Peel defects the size of the source-drain channel were visible on the Cr surface when it was examined under a microscope at 5x magnification.
[d]Peel defects were removed from the gate layer of this transistor. The procedure is similar to that used for the source-drain layer under the immediately preceding footnote c with the following exceptions: After removal of the pani gate layer donor, the receiver was left in place on the drum. The Cr-coated donor was placed on top of the receiver and peel defects were removed as previously described (footnote C).

TABLE J-2

Printing Patterns and Parameters for Printed TFT Arrays

| Ex | TFT Pattern | Dielectric Pattern | Printing Parameters Gate | Dielectric | Source-Drain |
|---|---|---|---|---|---|
| 58 | 1 | Solid | DS = 160 at 7.65 W | DS = 160 at 7.35 W | DS = 205 at 5.75 W |
| 59 | 2 | Solid | DS = 205 at 5.6 W | Laminated from WPTS ® at 3 min, 2250 lbs, 80° C. | DS = 205 at 5.20 W |
| 60 | 2 | Patterned | DS = 160 at 6.7 W | DS = 180 at 8.50 W | DS = 205 at 5.45 W |
| 61 | 3 | Solid | DS = 205 at 5.6 W | DS = 180 at 7.75 W | DS = 205 at 5.75 W |
| 62 | 3 | Solid | DS = 205 at 5.7 W | DS = 180 at 7.70 W | DS = 205 at 5.75 W |
| 63 | 1 | Solid | DS = 205 at 5.7 W | DS = 160 at 7.50 W | DS = 160 at 7.30 W |
| 64 | 2 | Solid | DS = 160 at 7.8 W | DS = 160 at 7.35 W | DS = 205 at 5.50 W |
| 65 | 2 | Solid | DS = 160 at 7.8 W | DS = 160 at 7.35 W | DS = 205 at 5.50 W |
| 66 | 2 | Solid | DS = 160 at 7.6 W | DS = 200 at 9.50 W | DS = 205 at 5.60 W |
| 67 | 2 | Solid | DS = 160 at 7.6 W | DS = 160 at 7.40 W | DS = 205 at 5.60 W |
| C-4 | 2 | Solid | DS = 160 at 6.75 W | Laminated from R-3 at 3 min, 2250 lbs, 80° C. | DS = 205 at 5.45 W |

TABLE J-3

Electrical Performance of Printed TFT Arrays

| Ex | Array Size | Median Mobility ($cm^2V^{-1}s^{-1}$) | Median $V_{Th}$ (V) | Median $I_{off}$ (A) | Median $I_{on}/I_{off}$ | Yield |
|---|---|---|---|---|---|---|
| 58 | 54 | 0.06 | −8 | 1.0E−11 | 1E+05 | 98.1% |
| 59 | 54 | 0.010 | −15 | 1.0E−11 | 3.2E+04 | 98.1% |
| 60 | 54 | 0.001 | −12 | 3.2E−12 | 3.2E+03 | 96.3% |
| 61 | 108 | 0.05 | −7 | 1.0E−10 | 3.2E+03 | 75.9% |
| 62 | 108 | 0.05 | 5 | 3.2E−11 | 2.0E+03 | 72.2% |
| 63 | 54 | 0.02 | 5 | 1.0E−10 | 3.2E+03 | 100%[a] |
| 64 | 108 | 0.00025 | −22 | 3.2E−12 | 6.3E+02 | 76.9% |
| 65 | 54 | 0.008 | −18 | 6.3E−12 | 6.3E+02 | 92.6% |
| 66 | 54 | 0.025 | −12 | 6.3E−12 | 4.0E+04 | 92.6% |
| 67 | 54 | 0.07 | −5 | 5.0E−11 | 2.0E+04 | 94.4% |
| C-4 | 54 | 0.003 | −5 | 1.0E−11 | 3.2E+03 | 88.9% |

[a]Yield of corresponding capacitor array is also 100%, e.g., 100% of the 54 capacitors have $I_{leaks}$ of less than 1.0E−10 A with a median $I_{leaks}$ of 3.2E−12 A.

What we claim is:
1. A composition, comprising:
   a) one or more dielectric polymer(s) selected from the group consisting of: acrylic, styrenic and styrenic-acrylic latexes;
   b) one or more dielectric polymer(s) selected from the group consisting of solution-based acrylic, styrenic and styrenic-acrylic polymers; and
   c) about 0.5 wt % to about 10 wt %, based on a dry weight of the composition, of one or more near-IR dye(s);
   wherein a dry layer comprising said composition has a resistivity of $10^{14}$ ohm-cm or greater and has an absorption maximum in the range of about 600 to about 1200 nm.
2. The composition of claim 1, consisting essentially of:
   said one or more dielectric polymer(s); and
   said one or more near-IR dye(s).
3. The composition of claim 1 further comprising:
   d) a high κ nanoparticle fraction up to about 90 wt % based on the dry weight of the composition, with the proviso that if the nanoparticle fraction is greater than 80 wt %, the near-IR dye is less than 6 wt % of the composition.
4. A dielectric layer, having a resistivity of about $10^{14}$ ohm-cm or greater, comprising at least one Layer A, comprising:
   a) one or more dielectric polymer(s) selected from the group consisting of acrylic, styrenic and styrenic-acrylic latexes;
   b) one or more dielectric polymer(s) selected from the group consisting of solution-based acrylic, styrenic and styrenic-acrylic polymers; and
   c) about 0.5 wt % to about 10 wt %, based on a dry weight of Layer A, of one or more near-IR dye(s) having an absorption maximum in the range of about 600 to about 1200 nm within Layer A.
5. The dielectric layer of claim 4, wherein said acrylic, styrenic and styrenic-acrylic latexes comprise one or more latex resins comprising at least about 85 wt % of monomers selected from the group consisting of: alkyl (meth)acrylate, styrene, and alkyl-substituted styrene wherein the alkyl group is a C1 to C18 straight or branched chain alkyl group.
6. The dielectric layer of claim 4, wherein said one or more dielectric polymer(s) comprises a combination of about 20 to about 80 wt % of an acrylic or styrenic-acrylic latex fraction and about 20 to about 80 wt % of a solution-based acrylic or styrenic-acrylic polymer fraction, based on the dry weight of the combination.
7. The dielectric layer of claim 4 wherein the near-IR dye(s) is an indocyanine dye.
8. The dielectric layer of claim 4 wherein the near-IR dye(s) is selected from the group consisting of: 3H-indolium, 2-[2-[2-chloro-3-[(1,3-dihydro-1,3,3-trimethyl-2H-indol-2-ylidene)ethylidene]-1-cyclopenten-1-yl]ethenyl]-1,3,3-trimethyl-, salt with trifluoromethanesulfonic acid (1:1) having CAS No. [128433-68-1]; 2-(2-(2-chloro-3-(2-(1,3-dihydro-1,1-dimethyl-3-(4-sulphobutyl)-2H-benz[e]indol-2-ylidene)ethylidene)-1-cyclohexene-1-yl)ethenyl)-1,1-dimethyl-3-(4-sulphobutyl)-1H-benz[e]indolium, inner salt, free acid having CAS No. [162411-28-1]; and indolenine dyes of formula (I) and (II) and resonance structures thereof

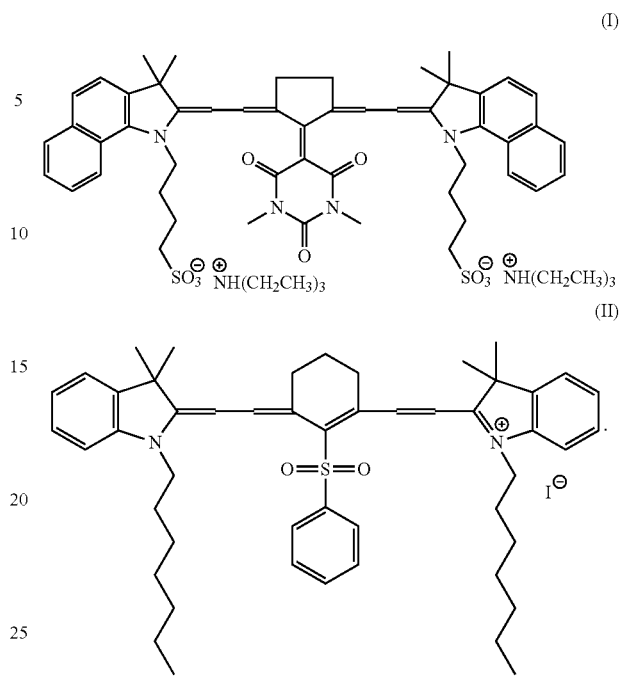

9. The dielectric layer of claim 4 comprising two or more Layers A that are gradient dye layers, each gradient dye layer independently having a dry wt % of near-IR dye of about 0.5 to about 10 wt %; wherein at least one gradient dye layer has a lower wt % of near-IR dye, at least one gradient dye layer has a higher wt % of near-IR dye, and said higher wt % of near-IR dye is a value at least 20% higher than that of the lower wt % of near-IR dye.
10. The dielectric layer of claim 4 further comprising an additional dielectric layer comprising one or more dielectric polymers characterized by a resistivity of about $10^{14}$ ohm-cm or greater.
11. The dielectric layer of claim 4 wherein said Layer A further comprises a high κ nanoparticle fraction of up to about 90 wt % of Layer A, with the nanoparticle fraction having a dielectric constant greater than about 20 and an average particle size of about 5 nm to about 500 nm; with the proviso that if the nanoparticle fraction is greater than 80 wt %, the near-IR dye is less than 6 wt % of Layer A.
12. The dielectric layer of claim 11 comprising two or more Layers A that are gradient nanoparticle layers, each gradient nanoparticle layer independently having a dry wt % of high κ nanoparticle fraction of up to about 90 wt %; wherein at least one gradient nanoparticle layer has a lower wt % of high κ nanoparticle fraction, at least one gradient nanoparticle layer has a higher wt % of high κ nanoparticle fraction, and said higher wt % is a value at least 20% higher than that of the lower wt %.
13. The dielectric layer of claim 4, wherein said Layer A consists essentially of:
   said one or more dielectric polymer(s); and
   said one or more near-IR dye(s).

* * * * *